(12) United States Patent
Usami

(10) Patent No.: US 10,256,133 B2
(45) Date of Patent: Apr. 9, 2019

(54) METHOD OF MANUFACTURING SEMICONDUCTOR DEVICE

(71) Applicant: RENESAS ELECTRONICS CORPORATION, Tokyo (JP)

(72) Inventor: Tatsuya Usami, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/795,051

(22) Filed: Oct. 26, 2017

(65) Prior Publication Data
US 2018/0151410 A1    May 31, 2018

(30) Foreign Application Priority Data

Nov. 28, 2016  (JP) ................................. 2016-229898

(51) Int. Cl.
| | | |
|---|---|---|
| *H01L 21/74* | (2006.01) | |
| *H01L 21/308* | (2006.01) | |
| *H01L 21/285* | (2006.01) | |
| *H01L 29/78* | (2006.01) | |
| *H01L 21/768* | (2006.01) | |

(52) U.S. Cl.
CPC ...... *H01L 21/743* (2013.01); *H01L 21/28518* (2013.01); *H01L 21/308* (2013.01); *H01L 21/76879* (2013.01); *H01L 29/7816* (2013.01)

(58) Field of Classification Search
CPC ............. H01L 21/743; H01L 21/28518; H01L 21/76879; H01L 21/308; H01L 29/7816
See application file for complete search history.

(56) References Cited

U.S. PATENT DOCUMENTS

| | | | |
|---|---|---|---|
| 10,038,061 B2 * | 7/2018 | Ning | .................... H01L 29/407 |
| 2017/0207335 A1 * | 7/2017 | Lin | .................... H01L 29/0696 |

FOREIGN PATENT DOCUMENTS

JP            2013-222838 A        10/2013

* cited by examiner

*Primary Examiner* — Sonya D. McCall-Shepard
(74) *Attorney, Agent, or Firm* — McDermott Will & Emery LLP

(57) ABSTRACT

To improve the characteristics of a semiconductor device having a substrate contact formed in a deep trench. In a method of forming a plug PSUB in a deep trench DT2 that penetrates an n-type buried layer NBL and reaches a p-type epitaxial layer PEP1, the plug PSUB is formed in the deep trench DT2 after a metal silicide layer SIL1 is formed in the p-type epitaxial layer PEP1. The metal silicide layer SIL1 is formed using a PVD-first metal film (a first metal film formed by PVD). A first barrier metal film BM1 at the bottom of the plug PSUB is a CVD-second metal film (a second metal film formed by CVD). The first metal film is a metal film different from the second metal film.

17 Claims, 32 Drawing Sheets

METHOD OF MANUFACTURING SEMICONDUCTOR DEVICE

CROSS-REFERENCE TO RELATED APPLICATIONS

The disclosure of Japanese Patent Application No. 2016-229898 filed on Nov. 28, 2016 including the specification, drawings and abstract is incorporated herein by reference in its entirety.

The present invention relates to a method of manufacturing a semiconductor device and can be properly used for, in particular, a semiconductor device having a substrate contact formed in a deep trench.

BACKGROUND

In some cases, a metal oxide semiconductor (MOS) transistor is formed on a semiconductor substrate (epitaxial substrate) having an epitaxial layer or on a silicon-on-insulator (SOI) substrate.

For example, Japanese Unexamined Patent Application Publication No. 2013-222838 discloses a semiconductor device including a high-breakdown voltage MOS transistor and a CMOS transistor. An element formation region serving as a formation region of the high-breakdown voltage MOS transistor and the CMOS transistor is surrounded by isolation (deep trench isolation) formed in a deep trench.

SUMMARY

The present inventors have conducted research and development of semiconductor devices in which high-breakdown voltage MOS transistors, bipolar elements, and low-breakdown voltage MOS transistors are combined on semiconductor substrates (epitaxial substrates) having epitaxial layers. The inventors have diligently studied improvement of the characteristics of semiconductor devices.

In this technique, an element region is electrically isolated by isolation (DTI) formed in a deep trench that surrounds the element region. In such a semiconductor device having isolation (DTI) formed in a deep trench, feeding from a front side (element formation side) of a substrate requires the provision of a trench reaching the substrate at a deep position and the provision of a feeding plug (substrate contact) in the trench. However, it is difficult to stabilize the coupling resistance of the substrate contact formed in the deep trench, requiring a study of a substrate contact configuration having a proper coupling resistance and the fabrication method.

Other problems and new characteristics will be clarified by a description of the present specification and the accompanying drawings.

A method of manufacturing a semiconductor device according to an embodiment includes the steps of: preparing a semiconductor substrate having a first p-type silicon layer, an n-type silicon layer on the first p-type silicon layer, and a second p-type silicon layer on the n-type silicon layer; and forming a MOS transistor on the second p-type silicon layer in a first region on a major surface of the semiconductor substrate, the MOS transistor having a gate electrode, a source region, and a drain region. The method further includes the steps of: forming a trench that penetrates, in a second region different from the first region, the second p-type silicon layer and the n-type silicon layer from the major surface of the semiconductor substrate and reaches the first p-type silicon layer; forming a silicide layer on the first p-type silicon layer exposed at the bottom of the first trench, the silicide layer including a first metal film; and forming a plug electrode in the trench.

The semiconductor device according to the representative embodiment disclosed in the present application can achieve improved characteristics.

DETAILED DESCRIPTION

Figure 1:
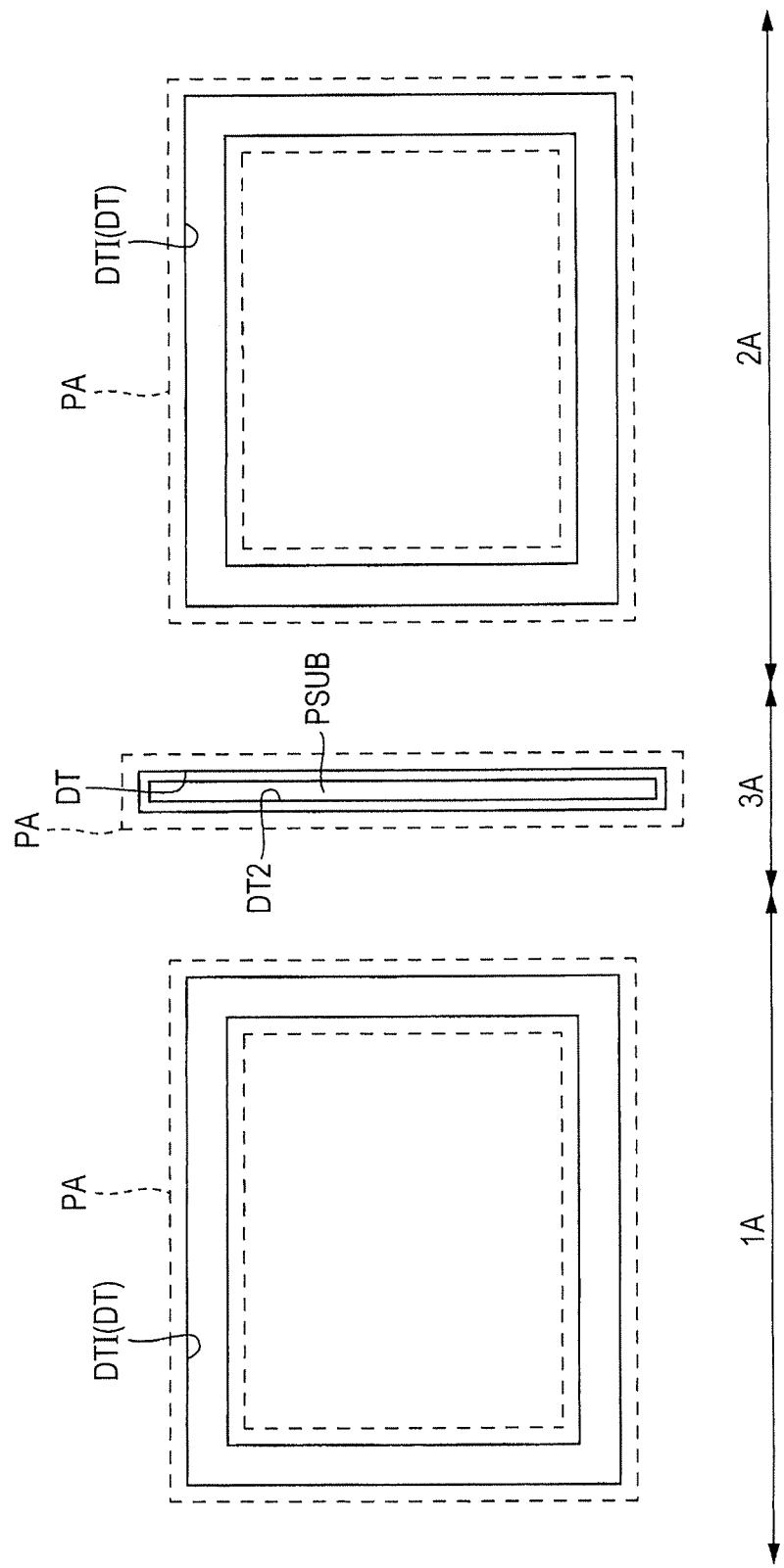
FIG. 1 is a plan view showing the configuration of a semiconductor device according to a first embodiment.

For the convenience of explanation, a plurality of sections or the embodiments will be separately described in the following embodiments. The sections or embodiments are relevant to one another unless otherwise specified. One of the sections or embodiments is, for example, a modification, an application, a detailed explanation, and a supplementary explanation of some or all of the other sections or embodiments. In the following embodiments, the number of elements (including a number, a numeric value, an amount, and a range) is not limited to a specific number unless otherwise specified or clearly limited to the specific number in theory. Thus, the number of elements may be larger or smaller than the specific number.

Obviously, the constituent elements (including element steps) of the following embodiments are not always necessary unless otherwise specified or clearly required in theory. Similarly, the shapes and positional relationships of constituent elements in the following embodiments substantially include the close or similar shapes of the constituent elements unless otherwise specified or clearly excluded in theory. This also holds for the number of elements (including a number, a numeric value, an amount, and a range).

The embodiments will be specifically described below in accordance with the accompanying drawings. In all the explanatory drawings of the following embodiments, members having the same functions are indicated by the same or associated reference numerals and the repeated explanation thereof is omitted. Furthermore, similar members (parts) may be indicated by characters in addition to generic reference numerals so as to be designated as individual or specific parts. In the following embodiments, the same or similar parts will not be repeatedly explained in principle unless otherwise required.

In the drawings of the embodiments, hatching may be omitted to provide ease of viewing even in cross section. In addition, hatching may be provided in plan view to improve visibility.

Moreover, parts in the cross-sectional and plan views may not be sized for actual devices. For simplification, a specific part may be illustrated in a relatively large size. Furthermore, for simplification of a correspondence between the cross-sectional and plan views, a specific part may be illustrated in a relatively large size.

First Embodiment

The structure of a semiconductor device according to the present embodiment (first embodiment) will be described below with reference to the accompanying drawings.

[Structure Explanation]

Figure 2:
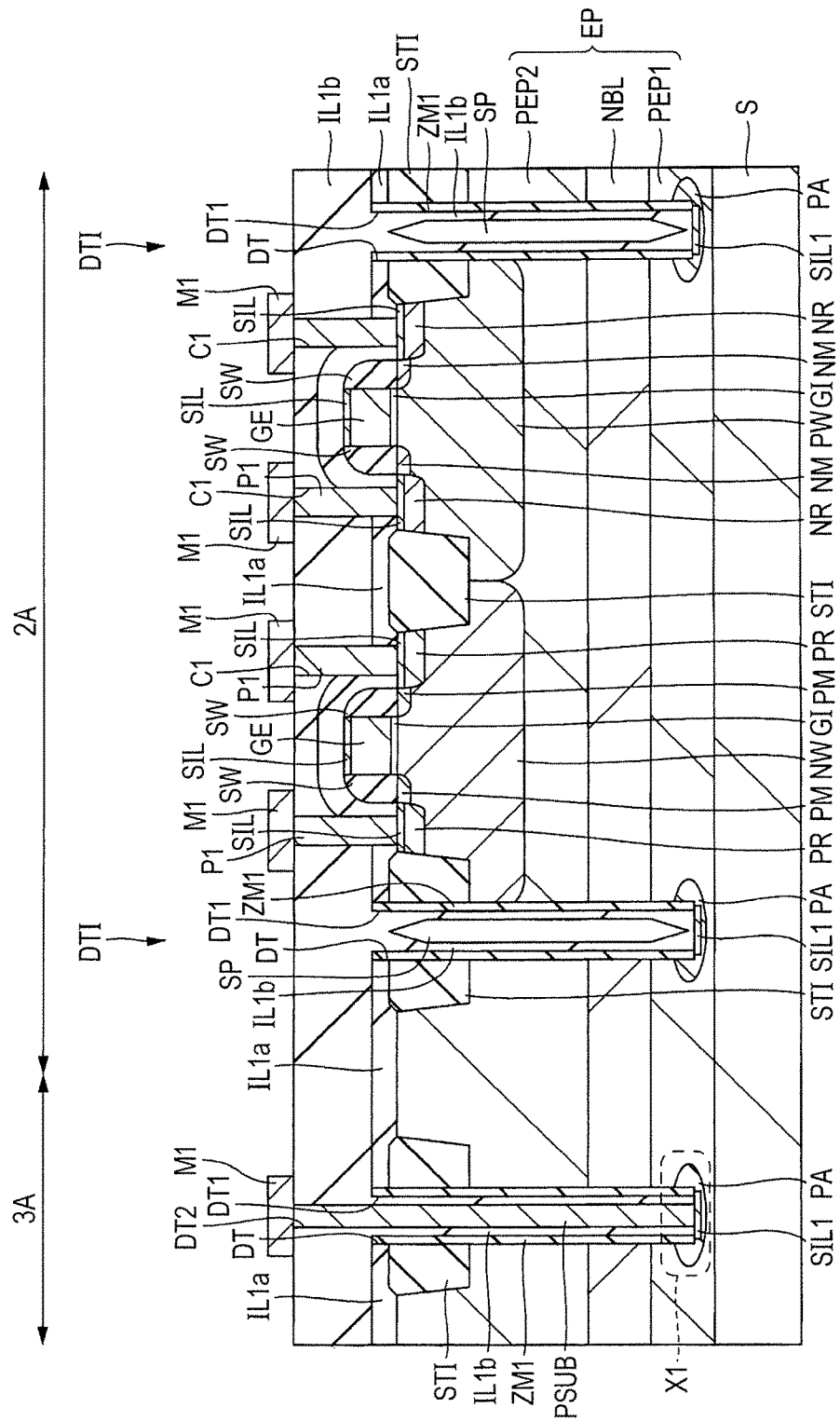
FIG. 2 is a cross-sectional view showing the configuration of the semiconductor device according to the first embodiment.
Figure 3:
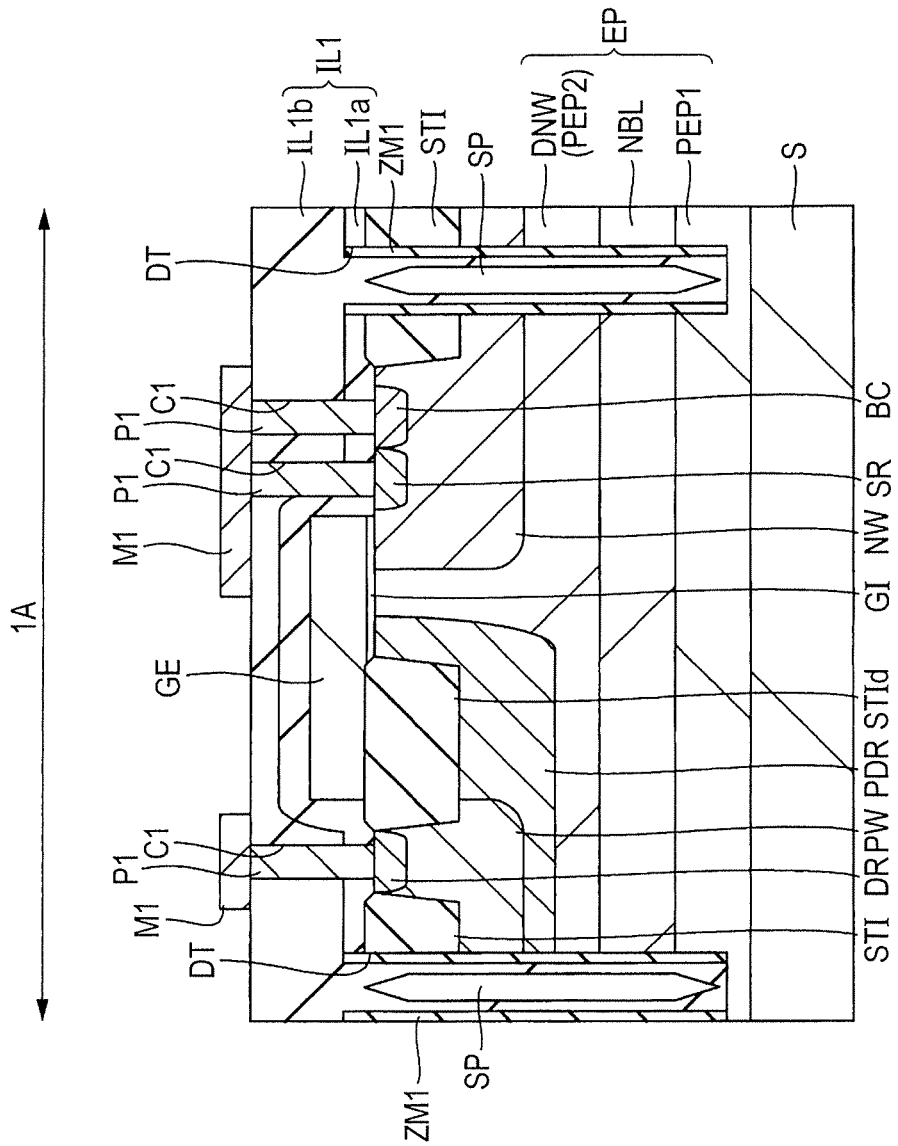
FIG. 3 is a cross-sectional view showing the configuration of the semiconductor device according to the first embodiment.

FIG. 1 is a plan view showing the configuration of the semiconductor device according to the first embodiment. FIGS. 2 and 3 are cross-sectional views showing the configuration of the semiconductor device according to the first embodiment.

As shown in FIG. 1, the semiconductor device of the present embodiment includes, as partial regions on a semiconductor substrate (substrate), a first element formation region 1A, a second element formation region 2A, and a feeding region 3A. The feeding region 3A is arranged, but not exclusively, between the first element formation region 1A and the second element formation region 2A.

The semiconductor substrate includes a support substrate S on which an epitaxial layer EP is formed. The support substrate S is made of, for example, p-type single crystal silicon having a specific resistance of about 1 to 10 Ωcm. The semiconductor substrate is a substantially circular semiconductor wafer including the epitaxial layer EP formed over the p-type single-crystal silicon substrate (S).

In this configuration, the epitaxial layer EP includes a p-type epitaxial layer PEP1 formed on the support substrate (S), an n-type buried layer (may be called an n-type epitaxial layer, an n-type buried region, or an n-type semiconductor region) NBL formed on the p-type epitaxial layer PEP1, and a p-type epitaxial layer PEP2 formed on the n-type buried layer NBL (FIG. 2). The impurity concentrations of the p-type epitaxial layers PEP1 and PEP2 are lower than that of the support substrate S (in other words, a higher resistance). The semiconductor substrate sequentially has the support substrate (S), the p-type epitaxial layer PEP1, the n-type buried layer NBL, and the p-type epitaxial layer PEP2 from the lower part of FIG. 2. In other words, the semiconductor substrate includes a p-type silicon layer (the support substrate S and the p-type epitaxial layer PEP1), an n-type silicon layer (n-type buried layer NBL), and a p-type silicon layer (p-type epitaxial layer PEP2). The upper sides of the layers including the semiconductor substrate will be called major surfaces (top surfaces) and the lower sides of the layers will be called back sides (undersurface) in FIG. 2. The major surface of the semiconductor substrate is the major surface of the p-type epitaxial layer PEP2. Elements (e.g., an LDMOS transistor or a MOS transistor as will be discussed later) are formed on the major surface of the semiconductor substrate.

As shown in FIG. 3, a laterally diffused metal-oxide-semiconductor (LDMOS) field effect transistor is formed in the first element formation region 1A of the semiconductor substrate. More specifically, the LDMOS transistor is formed on the major surface of an n-type well region DNW formed by doping the p-type epitaxial layer PEP2 of the semiconductor substrate with an n-type impurity. The LDMOS transistor is a high-breakdown voltage transistor that may be called a lateral power MOSFET. In FIG. 3, a p-channel LDMOS transistor is illustrated. As shown in FIG. 1, a deep trench isolation DTI seamlessly (continuously) surrounds the periphery (circumference) of the LDMOS transistor. As will be discussed later, the deep trench isolation DTI includes a deep trench DT filled with an insulating film having a gap.

The LDMOS transistor has a gate electrode GE that is formed above the semiconductor substrate (n-type well region DNW) with a gate insulating film GI interposed between the gate electrode GE and the semiconductor substrate, and a source region SR and a drain region DR that are formed on both sides of the gate electrode GE (laterally in FIG. 3).

The n-type well regions (DNW and NW) between the source region (a $p^+$-type semiconductor region, a $p^+$-type impurity region, a $p^+$-type diffusion region) SR and the drain region (a p$^+$-type semiconductor region, a p$^+$-type impurity region, a p$^+$-type diffusion region) DR serves as a channel formation region. Between the channel formation region and the drain region DR, a p-type drift region PDR and a drain insulation region (field drain region) STId are provided so as to reduce electric field strength on one end of the gate electrode GE near the drain region DR (field plate effect). This can increase the breakdown voltage of the LDMOS transistor.

The configuration of the LDMOS transistor will be more specifically described below.

The source region SR is formed in the n-type well region (n-type semiconductor region) NW. The channel formation region is a region where the n-type well regions NW and DNW and the gate electrode GE overlap each other. The n-type well region NW has a higher impurity concentration than the n-type well region DNW.

Moreover, the drain region DR is formed in a p-type well region (p-type semiconductor region) PW. The p-type well region PW has a lower impurity concentration than the drain region DR. The p-type well region PW is formed in a p-type drift region (p-type semiconductor region) PDR. The p-type drift region PDR has a lower impurity concentration than the p-type well region PW. Furthermore, a drain insulation region STId is formed in the p-type drift region PDR and the p-type well region PW. The gate electrode GE is extended from the top surface of the channel formation region onto the drain insulation region STId via the gate insulating film GI.

The n-type well region NW contains an n$^+$-type body contact region (back gate region) BC adjacent to the source region SR. The source region SR and the n$^+$-type body contact region BC are coupled to a common wire M1. In other words, the n-type buried layer NBL has substantially the same potential as the source region SR but the n-type buried layer NBL arranged below the LDMOS transistor is isolated from the n-type buried layers NBL of other regions (the second element formation region 2A and the feeding region 3A) by a deep trench (may be called the deep trench isolation (DTI)) DT. Thus, even the source region having a high voltage does not adversely affect elements (transistors) around the source region. The deep trench DT penetrates the n-type buried layer NBL and reaches the p-type epitaxial layer PEP1.

The LDMOS transistor, the semiconductor regions (NW, PDR, PW, SR, DR, and BC), the gate electrode GE, and so on are formed in a region (active region) surrounded by an insulation region STI. The insulation region STI includes an insulating film embedded in the trench in the semiconductor substrate (epitaxial layer EP). Moreover, the deep trench DT penetrating the insulation region STI is provided in the insulation region STI. The deep trench DT contains the embedded insulating film. The insulating film may have a gap (may be called a cavity or an air gap) SP. In this way, the LDMOS transistor is formed in the region (active region) surrounded by the deep trench DT (FIGS. 1 and 3).

For example, the insulation region STI has a depth of about 0.3 μm and the deep trench DT has a depth of about 10 μm and a width of about 0.3 to 1 μm.

A plug (source plug) P1 is formed on each of the source region SR and the n$^+$-type body contact region BC while a plug (drain plug) P1 is formed on the drain region DR. Moreover, a plug (gate plug) P1, which is not illustrated in the cross section of FIG. 3, is formed on the gate electrode GE. These plugs P1 are arranged in contact holes (micro-holes) C1 formed in an interlayer insulating film IL1.

The second element formation region 2A of the semiconductor substrate has a MOS transistor (FIG. 2). More specifically, the MOS transistor is formed on the major surface of the p-type epitaxial layer PEP2 of the semiconductor substrate. FIG. 2 illustrates a complementary metal-oxide-semiconductor (CMOS) transistor. As shown in FIG. 2, an n-type MOS transistor (may be called an n-channel MOSFET) and a p-type MOS transistor (may be called a p-channel MOSFET) are formed on the major surface of the p-type epitaxial layer PEP2 of the semiconductor substrate. As shown in FIGS. 1 and 2, in the second element formation region 2A, the deep trench isolation DTI seamlessly (continuously) surrounds the periphery (circumference) of the CMOS transistor. In other words, the n-type buried layer NBL arranged below the n-type MOS transistor and the p-type MOS transistor is isolated from the n-type buried layers NBL of other regions (the first element formation region 1A and the feeding region 3A) by the deep trench isolation DTI.

The n-type MOS transistor is formed on the major surface of the p-type well region PW provided in the p-type epitaxial layer PEP2 of the semiconductor substrate. Specifically, the n-type MOS transistor includes the gate electrode GE that is formed on the p-type well region PW with the gate insulating film GI interposed between the gate electrode GE and the p-type well region PW, and source and drain regions that are formed on both sides of the gate electrode GE and in the semiconductor substrate (p-type well region PW) S. The source and drain regions each include a low-concentration n-type semiconductor region NM and a high-concentration n-type semiconductor region NR. This configuration is called an LDD structure. Side-wall insulating films SW are formed on both sides of the gate electrode GE. The low-concentration n-type semiconductor region NM is formed so as to be self-aligned with one side of the gate electrode GE, whereas the high-concentration n-type semiconductor region NR is formed so as to be self-aligned with one side of the side-wall insulating film SW.

The p-type MOS transistor is formed on the major surface of the n-type well region NW provided in the p-type epitaxial layer PEP2 of the semiconductor substrate. Specifically, the p-type MOS transistor includes the gate electrode GE that is formed on the n-type well region NW with the gate insulating film GI interposed between the gate electrode GE and the n-type well region NW, and source and drain regions that are formed on both sides of the gate electrode GE and in the semiconductor substrate (p-type well region PW). The source and drain regions each include a low-concentration p-type semiconductor region PM and a high-concentration p-type semiconductor region PR. This configuration is called an LDD structure. Side-wall insulating films SW are formed on both sides of the gate electrode GE. The low-concentration p-type semiconductor region PM is formed so as to be self-aligned with one side of the gate electrode GE, whereas the high-concentration p-type semiconductor region PR is formed so as to be self-aligned with one side of the side-wall insulating film SW.

Furthermore, a metal silicide layer (metal silicide film) SIL is formed on the high-concentration n-type semiconductor region NR, the high-concentration p-type semiconductor region PR, the gate electrode GE of the n-type MOS transistor, and the gate electrode GE of the p-type MOS transistor by a self-aligned silicide (salicide) technique. The metal silicide layer SIL includes, for example, a cobalt silicide (CoSi) layer, a nickel silicide (NiSi) layer, or a platinum-containing nickel silicide (NiPtSi) layer.

The n-type MOS transistor and the p-type MOS transistor are each formed in the region (active region) surrounded by the insulation region STI. The second element formation region 2A of FIG. 1 has a plurality of CMOS transistors (not shown). The deep trench isolation DTI is formed around the CMOS transistors. The deep trench isolation DTI has insulating films ZM1 and IL1b embedded in the deep trench DT penetrating the insulation region STI. As described above, the gap SP is formed in the insulating film IL1b embedded in the deep trench DT. The deep trench isolation DTI is formed around the CMOS transistors. The n-type MOS transistor and the p-type MOS transistor are isolated from each other by the insulation region STI. Moreover, the insulation region STI provides isolation between the n-type MOS transistors or between the p-type MOS transistors. In other words, in the second element formation region 2A, the MOS transistors are isolated from each other by the insulation region STI. The MOS transistors formed in the second element formation region 2A are isolated from the LDNOS transistor of the first element formation region 1A or a plug PSUB of the feeding region 3A by the deep trench isolation DTI. Specifically, the n-type buried layer NBL of the second element formation region 2A is isolated from the n-type buried layer NBL of the first element formation region 1A or the n-type buried layer NBL of the feeding region 3A by the deep trench isolation DTI.

The plugs (plug electrodes) P1 are formed on the high-concentration n-type semiconductor region NR (metal silicide layer SIL) and the high-concentration p-type semiconductor region PR (metal silicide layer SIL). The high-concentration n-type semiconductor region NR (metal silicide layer SIL) and the high-concentration p-type semiconductor region PR (metal silicide layer SIL) are coupled to the plugs P1. The plug P1 is also formed on the gate electrode GE but is not illustrated in the cross section of FIG. 2. The plugs P1 are arranged in the contact holes C1 formed in the interlayer insulating film IL1.

The plug (plug electrode) PSUB that penetrates the n-type buried layer NBL and reaches the p-type epitaxial layer PEP1 under the n-type buried layer NBL is provided in the feeding region 3A of the semiconductor substrate. The p-type epitaxial layer PEP1 is in contact with the support substrate S and has the same conductivity type as the support substrate S. Thus, for example, a ground potential is supplied to the semiconductor substrate (S, PEP1) below the n-type buried layer NBL through the plug PSUB. In other words, the semiconductor substrate (S, PEP1) is fixed at a ground potential through the plug PSUB. The plug PSUB includes a conductive film embedded in the deep trench DT2. The deep trench DT2 is arranged in the deep trench DT with the insulating films ZM1 and IL1b interposed between the deep trench DT2 and the deep trench DT. The deep trench DT2 has an aspect ratio of at least 15. Moreover, the deep trench DT2 has an opening width of 0.8 μm or less. Furthermore, the deep trench has a depth of at least 12 μm. The deep trench DT2 is substantially rectangular (linear) (FIG. 1) or has a substantially rectangular (linear) part in plan view. For example, the length of the deep trench DT2 is at least ten times the opening width of the deep trench DT2.

The plug PSUB includes a laminated film of a CVD-Ti film, a CVD-TiN film, and a CVD-W film that are embedded in the deep trench DT2. These films are not shown in FIG. 2. For example, the CVD-Ti film is 10 min thickness and the CVD-TiN film is 5 nm to 10 nm in thickness. The CVD-W film is so thick as to fill the deep trench DT2.

A CVD-metal film means a metal film formed by chemical vapor deposition (CVD). Thus, the laminated film of the CVD-Ti film, the CVD-TiN film, and the CVD-W film serves as a laminated film of a CVD-first metal film, a nitride film of a CVD-first metal (a compound film of a first metal), and a CVD-second metal film.

The p-type epitaxial layer PEP1 exposed at the bottom of the deep trench DT2 has a p-type impurity region (semiconductor region) PA. The p-type impurity region PA has a higher concentration than the p-type epitaxial layer PEP1. The metal silicide layer SIL1 is provided on a boundary between the CVD-Ti film and the p-type impurity region PA. The metal silicide layer SIL1 preferably has a lower resistance than a cobalt silicide (CoSi) layer, a nickel silicide (NiSi) layer, or a titanium silicide (TiSi) layer, e.g., a nickel-containing platinum silicide (NiPtSi) layer. The metal silicide layer SIL1 is provided in the p-type impurity region PA and is in contact with the CVD-Ti film at the bottom of the plug PSUB. In other words, the metal silicide layer SIL1 preferably includes a third metal film different from the first metal film at the bottom of the plug PSUB.

Moreover, the metal silicide layer SIL1 is preferably formed using a PVD-metal film, which will be discussed later. The PVD-metal film means a metal film formed by physical vapor deposition (PVD) such as sputtering.

In the laminated film including the CVD-Ti film, the CVD-TiN film, and the CVD-W film that include the plug PSUB, the CVD-Ti film and the CVD-TiN film are conductive films including a barrier metal. The CVD-W film is a conductive film (may be called a main conductor film) that is a main component of the plug. The barrier metal is used to prevent diffusion of metals including the main conductor film or prevent a reaction between materials (in this case, Si) at the bottom of the plug and the main conductor film.

The plug P1 includes a conductive film embedded in the contact hole C1. The contact hole C1 has a smaller aspect ratio than the deep trench DT2, a smaller opening width than the deep trench DT2, and a smaller depth than the deep trench. The contact hole C1 has an aspect ratio of, for example, 7 or less, an opening width of 0.15 μm or less, and a depth of 0.8 μm or less. The contact hole C1 is substantially circular (or elliptic) in plan view. For example, in the case of the elliptic contact hole C1, the length of the major axis is three times or less that of the opening width (minor axis) in plan view.

The plug P1 can be formed by the same process as the plug PSUB. In this case, the plug P1 includes a laminated film of a CVD-Ti film, a CVD-TiN film, and a CVD-W film that are embedded in the contact holes C1. The metal silicide layer SIL is provided at the bottom of the contact hole C1. The metal silicide layer SIL includes a cobalt silicide (CoSi) layer, a nickel silicide (NiSi) layer, or a platinum-containing nickel silicide (NiPtSi) layer.

[Explanation of a Manufacturing Method]

Referring to FIGS. 4 to 11, a method of manufacturing the semiconductor device according to the first embodiment will be described to clarify the configuration of the semiconductor device. FIGS. 4 to 11 are cross-sectional views showing the steps of manufacturing the semiconductor device according to the first embodiment. In the explanation of the method of manufacturing the semiconductor device according to the present embodiment, the second element formation region 2A and the feeding region 3A will be discussed but the method of manufacturing the first element formation region 1A is omitted. FIG. 12 is an enlarged cross-sectional view of a part X1 in FIG. 2.

Figure 4:
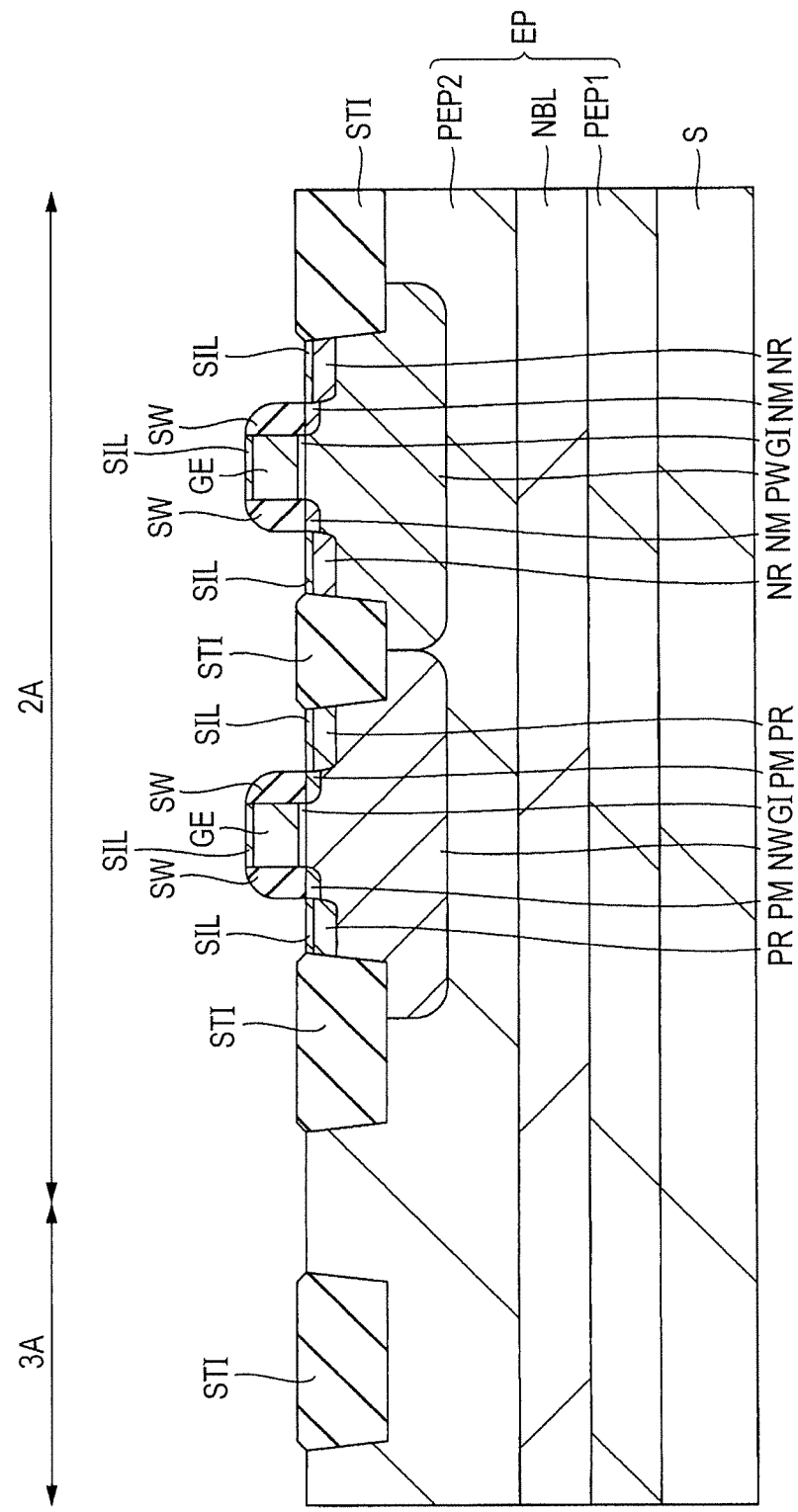
FIG. 4 is a cross-sectional view in the manufacturing process of the semiconductor device according to the first embodiment.

First, FIG. 4 shows the step of preparing the semiconductor substrate where the CMOS transistor includes the n-type MOS transistor and the p-type MOS transistor. The step of preparing the semiconductor substrate includes the following steps:

First, the semiconductor substrate having the epitaxial layer EP is prepared on the support substrate S. The semiconductor substrate includes the support substrate S made of a p-type single crystal silicon, the p-type epitaxial layer PEP1 formed over the major surface of the support substrate S, the n-type buried layer NBL formed on the p-type epitaxial layer PEP1, and the p-type epitaxial layer PEP2 formed on the n-type buried layer NBL. The major surface of the p-type epitaxial layer PEP1 is covered with the n-type buried layer NBL. The p-type epitaxial layer PEP1 and the p-type epitaxial layer PEP2 are isolated from each other by the n-type buried layer NBL. The p-type epitaxial layer PEP1 and the p-type epitaxial layer PEP2 have a specific resistance of, for example, about 1 to 10 Ωcm. The support substrate S may have a lower specific resistance than the p-type epitaxial layers PEP1 and PEP2. Moreover, the number of layers and the conductivity type of the epitaxial layer EP (PEP1, NBL, and PEP2) may be changed as needed. For example, the p-type epitaxial layer PEP2 may be an n⁻-type epitaxial film.

The semiconductor substrate has the feeding region 3A and the second element formation region 2A.

Subsequently, a hard mask (e.g., a laminated film including a silicon oxide film and a silicon nitride film formed on the silicon oxide film) not shown in FIG. 4 is formed on the semiconductor substrate, and then the hard mask and the epitaxial layer EP are etched to form an element isolation trench. After that, a silicon oxide film is deposited by, for example, CVD on the hard mask including the interior of the element isolation trench, and then the silicon oxide film outside the element isolation trench is removed by, for example, CMP. In this way, an insulating film, e.g., a silicon oxide film is embedded in the element isolation trench to form the insulation region STI. Such an element isolation method is called shallow trench isolation (STI). At this point, the drain insulation region STId including the LDMOS is also formed in the first element formation region 1A.

After that, the CMOS transistor (the n-type MOS transistor and the p-type MOS transistor) is formed. In the second element formation region 2A, the p-type well region PW and the n-type well region NW are formed in the p-type epitaxial layer PEP2. For example, a p-type impurity is ion-implanted into the p-type epitaxial layer PEP2 with a photoresist film (not shown) serving as a mask where the formation region of the p-type well region PW is opened. This forms the p-type well region PW. After that, the photoresist film (not shown) is removed by, for example, ashing, and then an n-type impurity is ion-implanted into the p-type epitaxial layer PEP2 with a photoresist film (not shown) serving as a mask where the formation region of the n-type well region NW is opened. This forms the n-type well region NW. After that, the photoresist film (not shown) is removed by, for example, ashing.

Subsequently, the gate insulating film GI and the gate electrodes GE are formed. For example, heat treatment (thermal oxidation) on the semiconductor substrate forms the gate insulating film GI, which includes a silicon oxide film, on the surfaces of the p-type well region PW and the n-type well region NW. The gate insulating film GI may include a film formed by CVD instead of the silicon oxide film. Moreover, an oxynitride film or a high-dielectric constant film (high-k film) is also usable in addition to the oxide film. After that, a polycrystalline silicon film (gate electrode layer) is deposited as a conductive film on the gate insulating film GI by, for example, CVD. The polycrystalline silicon film is then patterned by photolithography and dry etching, forming the gate electrodes GE.

Subsequently, the source and drain regions having LDD structures are formed on both sides of the gate electrode GE, in the p-type epitaxial layer PEP2. For example, the formation region (the n-type well region NW) of the p-type MOS transistor is covered with a photoresist film or the like, and then an n-type impurity (n-type impurity ion), e.g., arsenic (As) or phosphorus (P) is implanted into the p-type well region PW, on both sides of the gate electrode GE. This forms the n⁻-type semiconductor regions NM. At this point, the n⁻-type semiconductor region NM is formed so as to be self-aligned with one side wall of the gate electrode GE. The photoresist film (not shown) is then removed by, for example, ashing. Subsequently, for example, the formation region (p-type well region PW) of the n-type MOS transistor is covered with a photoresist film or the like, and then a p-type impurity (p-type impurity ion), e.g., boron (B) is implanted into the n-type well region NW, on both sides of the gate electrode GE. This forms the p⁻-type semiconductor regions PM. At this point, the p⁻-type semiconductor region PM is formed so as to be self-aligned with one side wall of the gate electrode GE. After that, the photoresist film (not shown) is removed by, for example, ashing.

Subsequently, the side-wall insulating film SW is formed at each side wall (on each side wall) of the gate electrode GE. For example, an insulating film, e.g., a silicon oxide film is deposited in the second element formation region 2A and then the insulating film is etched back so as to form the side-wall insulating film SW on each side wall of the gate electrode GE. The side-wall insulating film SW may be an insulating film including a single silicon oxide film, a single silicon nitride film, or a laminated film of a silicon oxide film and a silicon nitride film.

After that, for example, the formation region (n-type well region NW) of the p-type MOS transistor is covered with a photoresist film or the like, and then an n-type impurity, e.g., arsenic (As) or phosphorus (P) is implanted into the p-type well region PW by using the gate electrode GE and the side-wall insulating films SW as a mask. This forms the n⁺-type semiconductor regions NR. At this point, the n-type semiconductor region NR is formed so as to be self-aligned with the side-wall insulating film SW on one side wall of the gate electrode GE. The photoresist film (not shown) is then removed by, for example, ashing. Subsequently, for example, the formation region (p-type well region PW) of the n-type MOS transistor is covered with a photoresist film or the like, and then a p-type impurity (p-type impurity ion), e.g., boron (B) is implanted into the n-type well region NW by using the gate electrode GE and the side-wall insulating films SW as a mask. This forms the p⁺-type semiconductor regions PR. At this point, the p⁺-type semiconductor region PR is formed so as to be self-aligned with the side-wall insulating film SW on one side wall of the gate electrode GE. The photoresist film (not shown) is then removed by, for example, ashing. In this way, the source and drain regions are formed with LDD structures including the n⁻-type semiconductor regions NM and the n⁺-type semiconductor regions NR. Furthermore, the source and drain regions are formed with LDD structures including the p⁻-type semiconductor regions PM and the p⁺-type semiconductor regions PR. The n⁺-type semiconductor region NR has a higher impurity concentration and a deeper junction than the n⁻-type semiconductor region NM. The p⁺-type semiconductor region PR has a higher impurity concentration and a deeper junction than the p⁻-type semiconductor region PM.

Subsequently, heat treatment (activation) is performed to activate the impurities implanted into the source and drain regions.

The CMOS transistor can be formed by the foregoing steps. The metal silicide layer SIL is then formed on the source and drain regions (the n$^+$-type semiconductor region NR and the p$^+$-type semiconductor region PR) and the gate electrodes GE by the salicide technique. The metal silicide layer SIL can reduce a diffusion resistance, a contact resistance, and so on. For example, a Co film is formed as a metal film in the second element formation region 2A and then the semiconductor substrate is heat-treated, causing a reaction between the source and drain regions and the metal film and a reaction between the gate electrode GE and the metal film. Thus, cobalt silicide (CoSi) can be formed as the metal silicide layer SIL on the source and drain regions (the n$^+$-type semiconductor region NR and the p$^+$-type semiconductor region PR) and the gate electrodes GE. After that, the unreacted metal film is removed and then heat treatment is performed to reduce the resistance of the metal silicide layer SIL.

Figure 5:
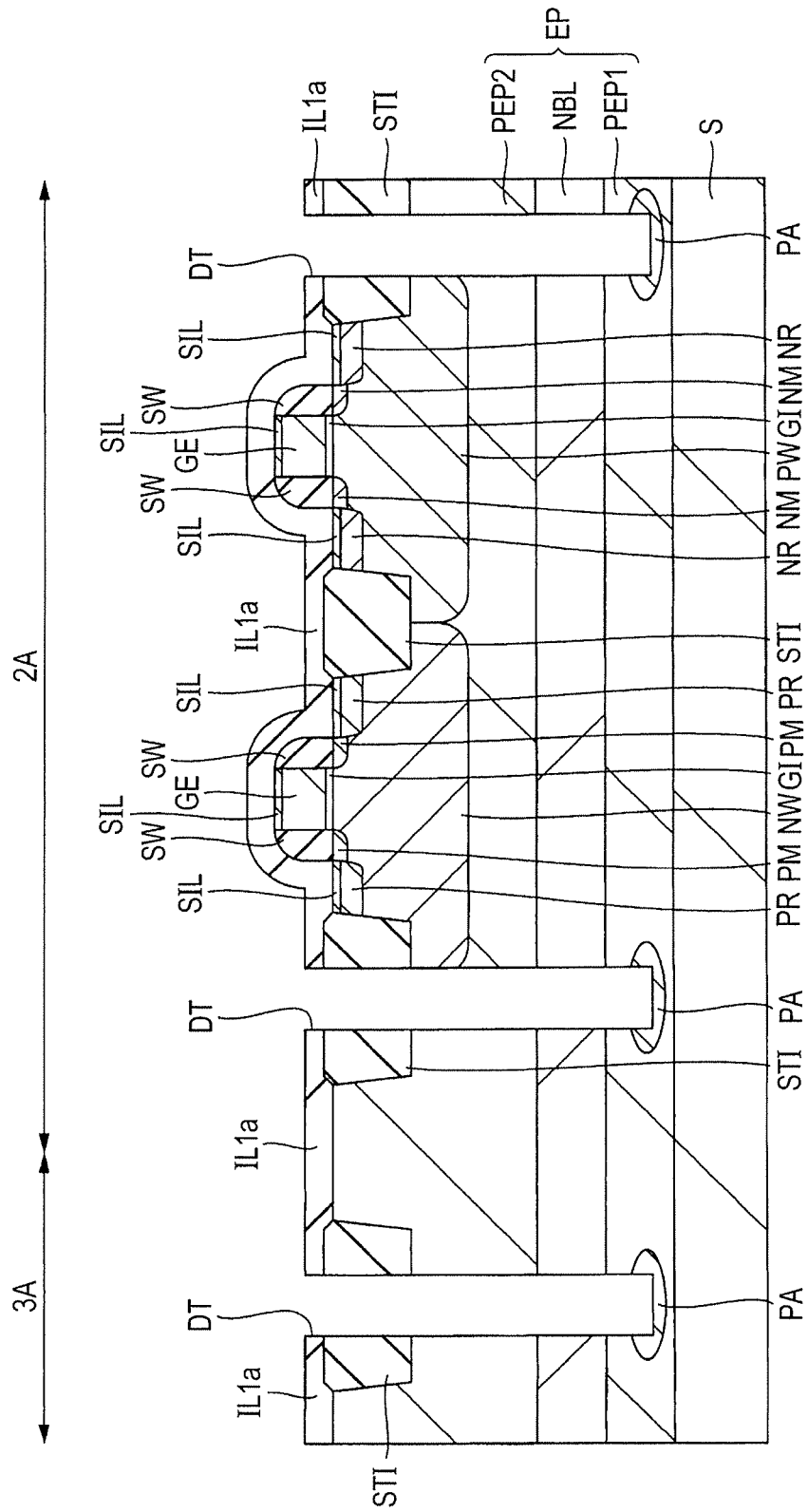
FIG. 5 is a cross-sectional view subsequent to FIG. 4 in the manufacturing process of the semiconductor device.

Subsequently, as shown in FIG. 5, an insulating film IL1a, e.g., a silicon oxide film is formed on the major surface of the semiconductor substrate by, for example, CVD. The insulating film IL1a is then etched with a photoresist film (not shown) serving as a mask where the formation region of the deep trench DT is opened. After that, the photoresist film (not shown) is removed and the semiconductor substrate is etched from the major surface to the undersurface of the semiconductor substrate with the insulating film IL1a serving as a mask, forming the deep trench DT. The bottom of the deep trench DT needs to reach, for example, the p-type epitaxial layer PEP1. For example, the deep trench DT is 1 μm in width and is 13 μm in depth. The deep trench DT is provided substantially at the center of the insulation region STI that distinguishes the active region. Thus, the deep trench DT is formed around the active region where the CMOS transistor is formed and the plug PSUB (FIGS. 1 and 2). In other words, the deep trench DT is arranged in the outer region of the second element formation region 2A. Moreover, the deep trench DT having a substantially rectangular (linear) shape is formed in the feeding region 3A.

Subsequently, a p-type impurity, e.g., boron (B) is implanted into the p-type epitaxial layer PEP1 that is exposed at the bottoms of the deep trenches DT formed in the second element formation region 2A and the feeding region 3A, and then heat treatment is performed so as to form the p-type impurity regions PA. As shown in FIG. 5, the p-type impurity regions PA formed in the p-type epitaxial layer PEP1 may reach the support substrate S. As shown in FIG. 1, in a direction orthogonal to the extending direction of the deep trench DT, the p-type impurity region PA is wider than the deep trench DT and the two ends of the p-type impurity region PA are located outside the facing side walls of the deep trench DT. In other words, as shown in FIG. 1, the deep trench DT is formed inside the p-type impurity region PA.

Figure 6:
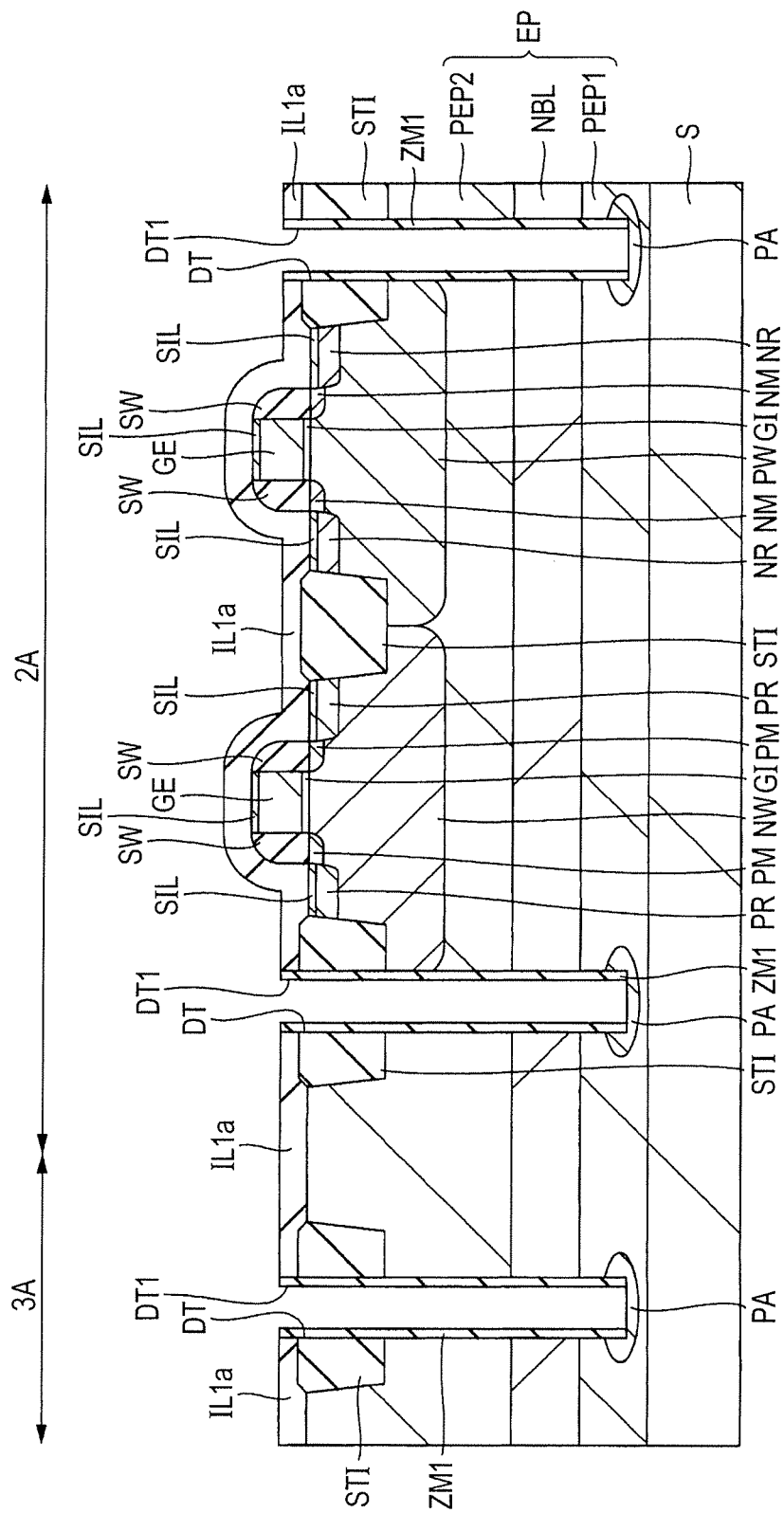
FIG. 6 is a cross-sectional view subsequent to FIG. 5 in the manufacturing process of the semiconductor device.

After that, as shown in FIG. 6, the insulating film ZM1 is formed on each side wall of the deep trench DT. First, an insulating film including, for example, a silicon oxide film is deposited on the major surface of the semiconductor substrate. The insulating film having a thickness of, for example, 50 to 90 nm is formed on the semiconductor substrate (that is, on the insulating film IL1a) and the side walls and bottoms of the deep trenches DT. Subsequently, anisotropic dry etching is perforated on the insulating film to remove the insulating film on the semiconductor substrate (that is, on the insulating film IL1a) and at the bottoms of the deep trenches DT. This forms the insulating film ZM1 on each side wall of the deep trench DT. The insulating film ZM1 surrounding the deep trench DT is continuously formed on each side wall of the deep trench DT from the entrance to the bottom of the deep trench DT. Since the insulating film ZM1 having a thickness of 50 to 90 nm is formed on each side wall of the deep trench DT, a deep trench DT1 determined by the insulating film ZM1 is formed inside the deep trench DT. The deep trench DT1 is smaller in width than the deep trench DT.

Figure 7:
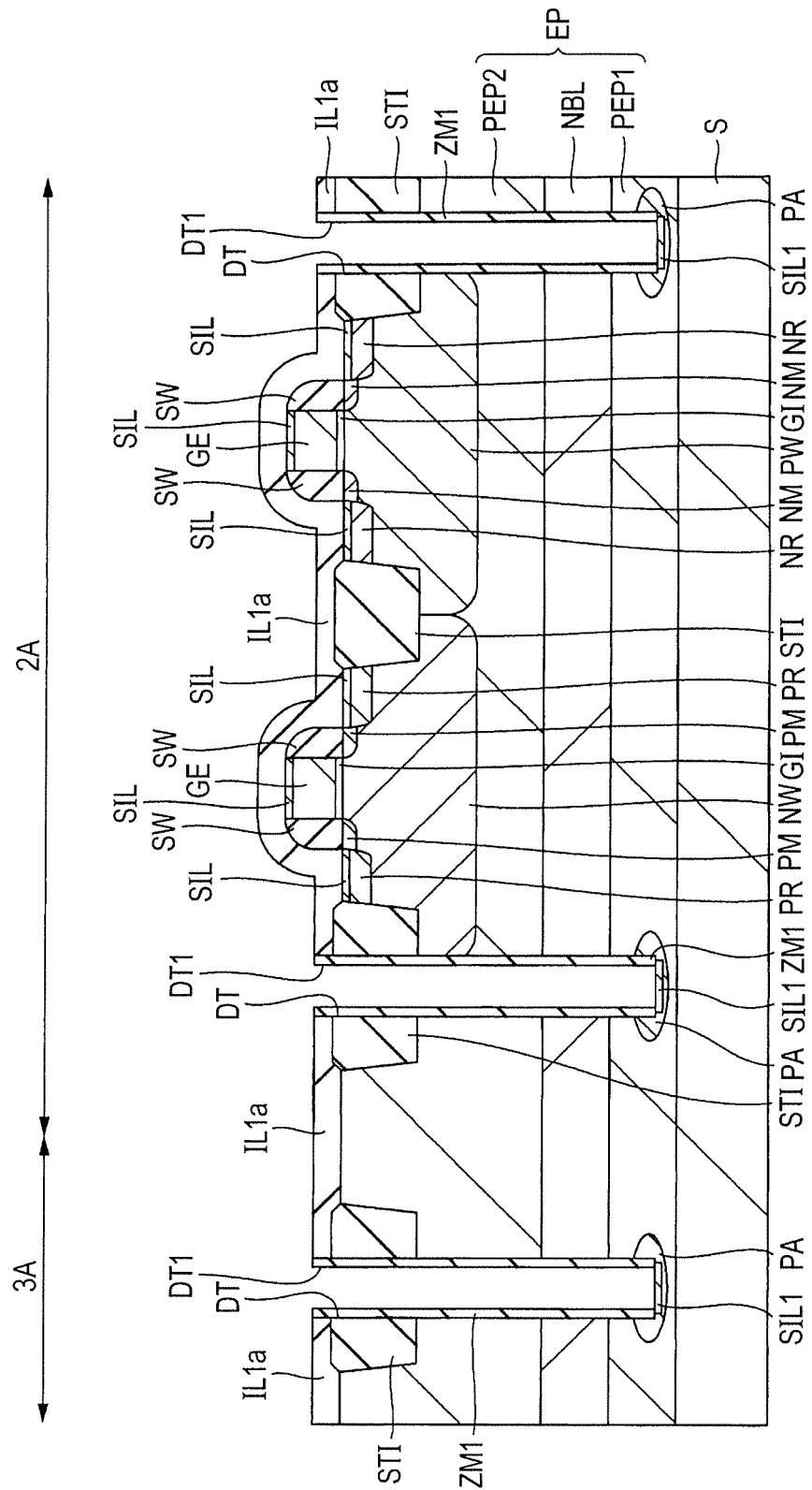
FIG. 7 is a cross-sectional view subsequent to FIG. 6 in the manufacturing process of the semiconductor device.

Subsequently, as shown in FIG. 7, the metal silicide layer SIL1 is formed at the bottom of the deep trench DT1. The metal silicide layer SIL1 is selectively formed at the bottom of the deep trench DT1 (that is, the p-type impurity region PA or the p-type epitaxial layer PEP1). The metal silicide layer SIL1 is formed over the p-type impurity region PA or the p-type epitaxial layer PEP1 that is exposed from the deep trench DT1 and has a thickness of, for example, 20 to 30 nm. The metal silicide layer SIL1 has a lower resistance than a cobalt silicide (CoSi) layer, a nickel silicide (NiSi) layer, or a titanium silicide (TiSi) layer, e.g., a nickel-containing platinum silicide (NiPtSi) layer. Specifically, a metal film containing Co, Ni, and Pt is deposited in the deep trench DT1 (on the side walls and the bottom) by PVD such as sputtering. After that, the metal film is heat-treated to form the metal silicide layer SIL1 at the bottom of the deep trench DT1. In other words, a silicide reaction forms the metal silicide layer SIL1 on a part where the metal film and the silicon layer of the p-type epitaxial layer PEP1 are in contact with each other. Subsequently, the unreacted metal film on the insulating film ZM1 and the insulating film IL1a is removed in the deep trench DT1 so as to leave the metal silicide layer SIL1 only at the bottom of the deep trench DT1. After the removal of the unreacted metal film, the metal silicide layer SIL1 may be heat-treated to reduce the resistance of the metal silicide layer SIL1. The metal silicide layer SIL1 is formed in the depth direction and the lateral direction (in-plane direction) of the semiconductor substrate and thus the metal silicide layer SIL1 in the deep trench DT1 is wider than the deep trench DT1 in cross section, which will be specifically discussed later. In other words, the metal silicide layer SIL1 overlapping the insulating film ZM1 extends in the lateral direction.

Figure 8:
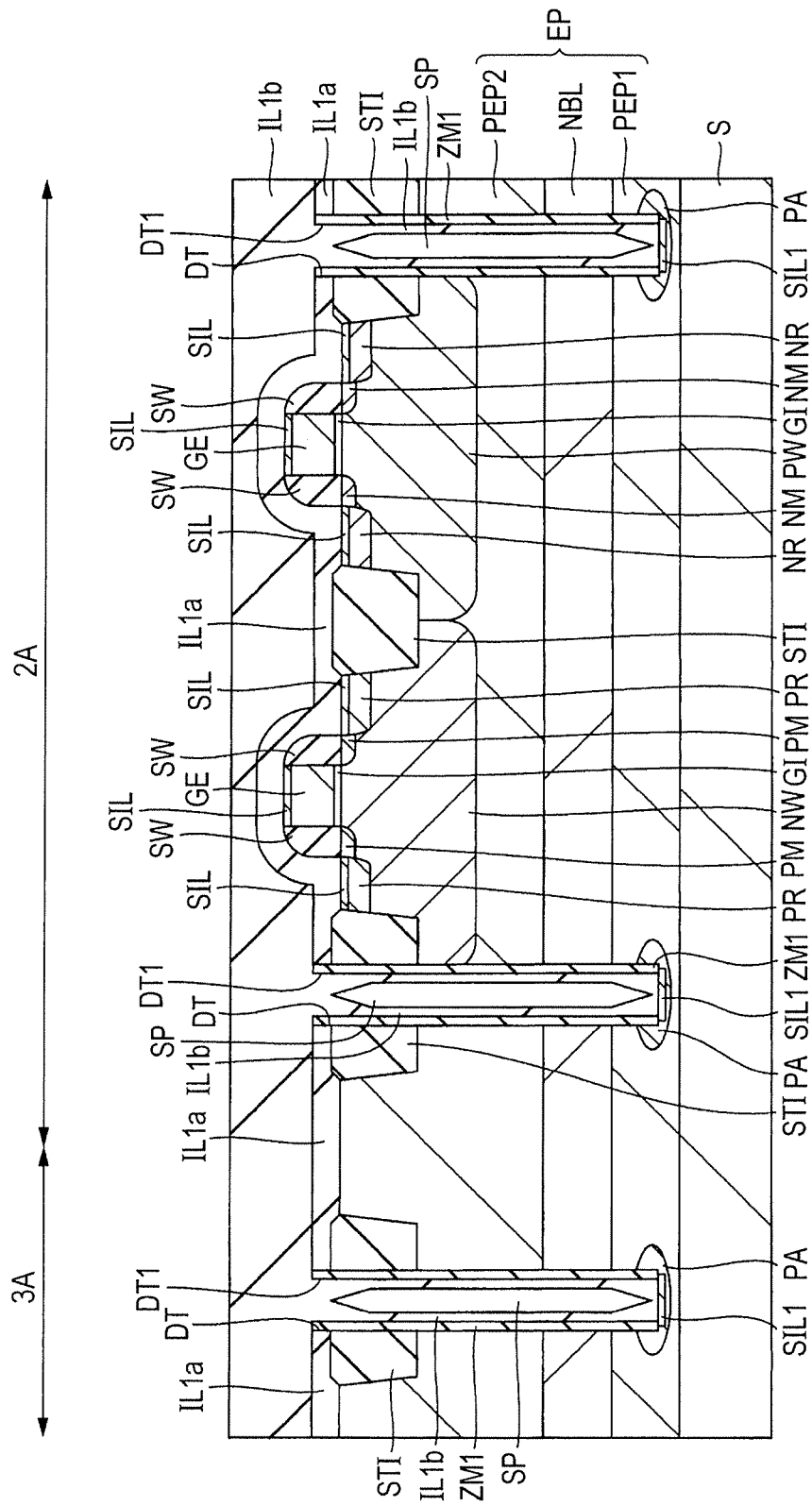
FIG. 8 is a cross-sectional view subsequent to FIG. 7 in the manufacturing process of the semiconductor device.

After that, as shown in FIG. 8, an insulating film, e.g., a silicon oxide film is deposited by, for example, CVD on the semiconductor substrate as well as the interior of the deep trench DT1. The insulating film is formed on the side walls and bottom of the deep trench DT1 with the gap SP formed at the center of the deep trench DT1. The upper part of the silicon oxide film is then planarized by, for example, CMP to form the insulating film IL1b. The silicon oxide film is formed such that the top surface of the silicon oxide film is higher than that of the insulating film IL1a on the gate electrode GE after the planarization. In other words, even after the formation of the gap SP, the gap SP is not exposed from the top surface of the insulating film IL1b and the upper end of the gap SP is lower than the top surface of the insulating film IL1b. This forms an interlayer insulating film IL1 including the insulating films IL1a and IL1b.

Figure 9:
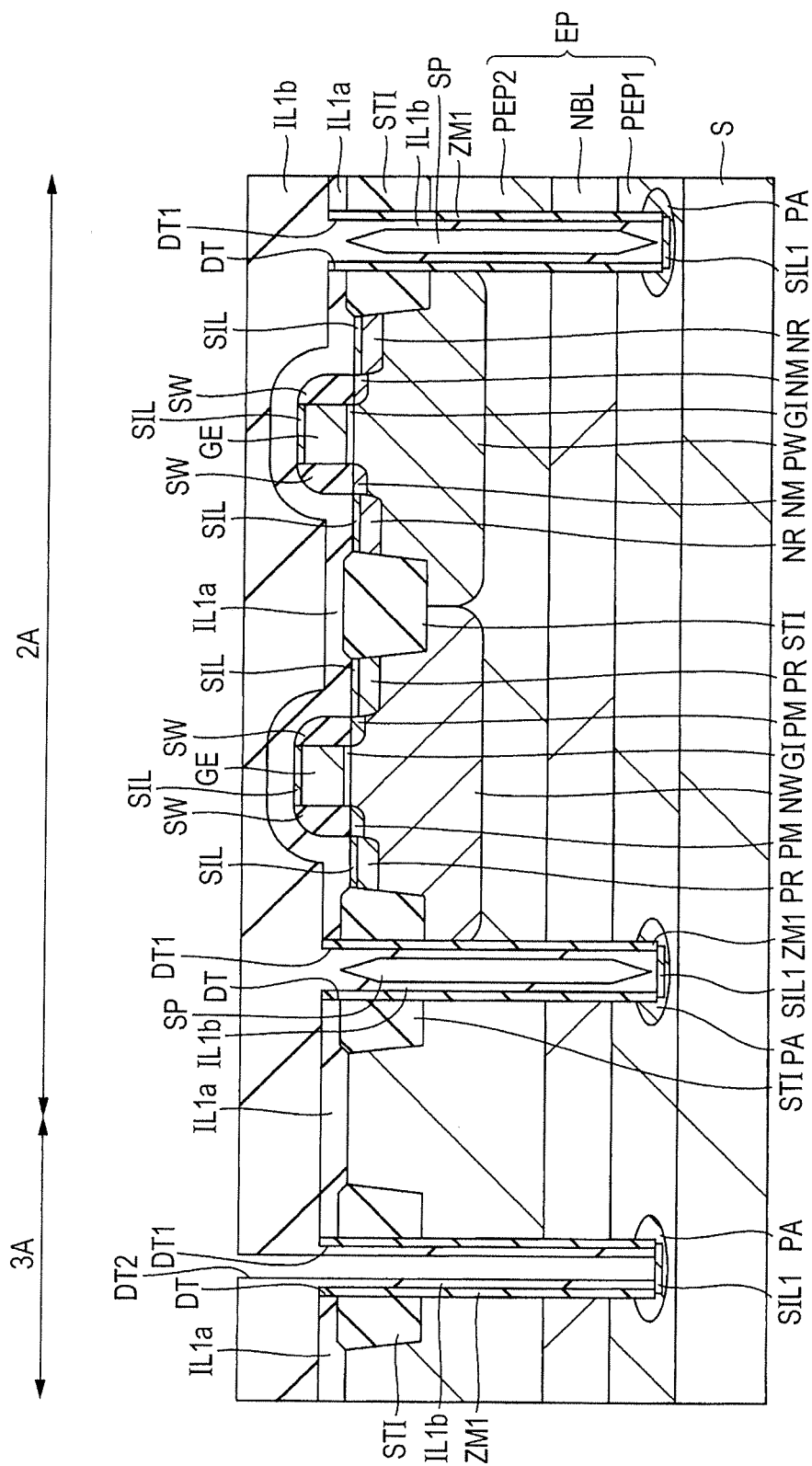
FIG. 9 is a cross-sectional view subsequent to FIG. 8 in the manufacturing process of the semiconductor device.

Subsequently, as shown in FIG. 9, the deep trench DT2 is formed in the feeding region 3A. The insulating film IL1b is etched with a photoresist film (not shown) serving as a mask where the formation region of the plug PSUB is opened in the feeding region 3A. Thus, the deep trench DT2 determined by the insulating film IL1b is formed in the deep trench DT1. At this point, the formation of the gap SP in the deep trench DT1 facilitates the formation of the deep trench DT2. The insulating film IL1b may be left on the side walls of the deep trench DT2. The metal silicide layer SIL1 is exposed from the bottom of the deep trench DT2. After that, the photoresist film (not shown) is removed by, for example, ashing.

Figure 10:
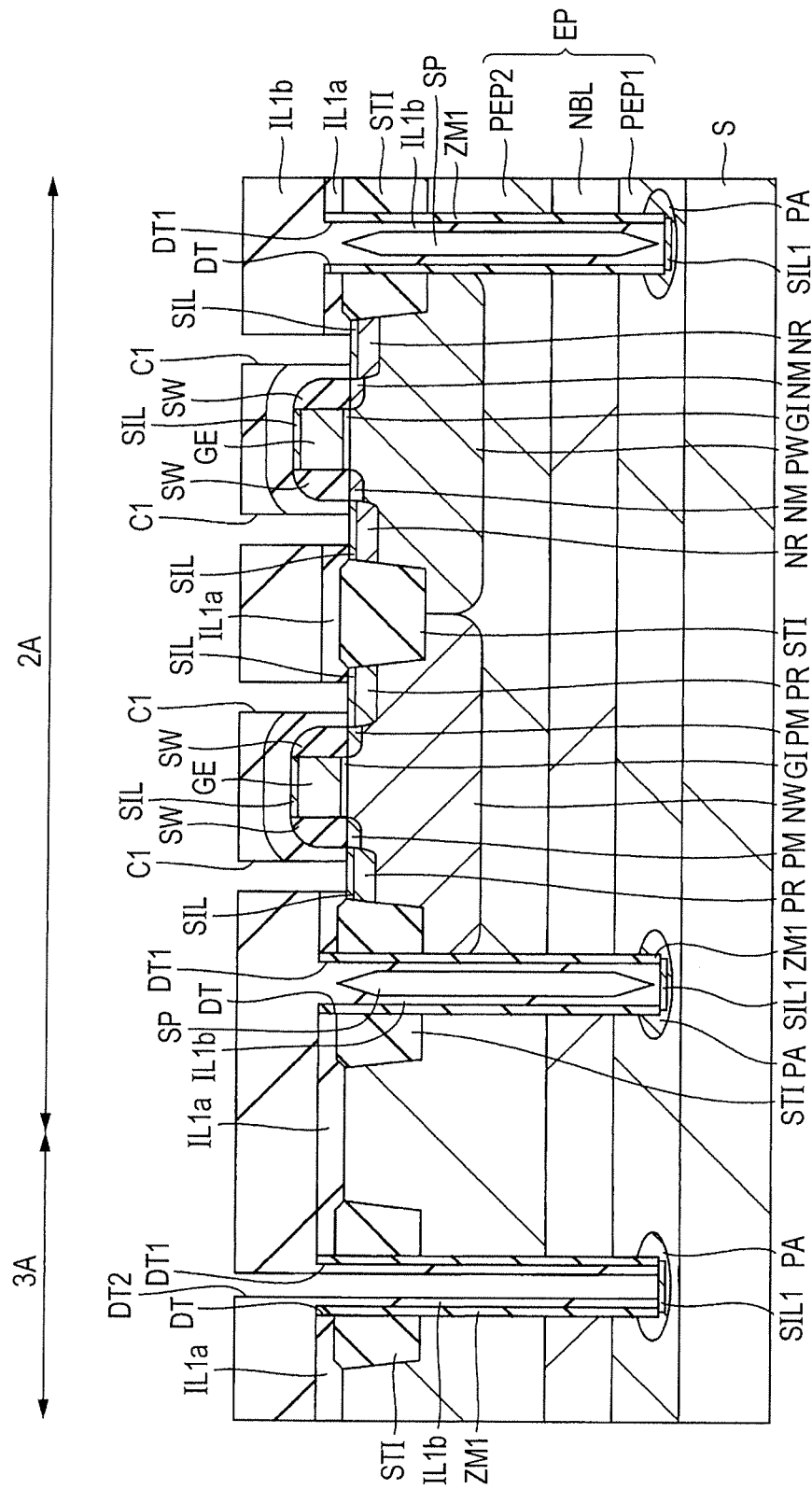
FIG. 10 is a cross-sectional view subsequent to FIG. 9 in the manufacturing process of the semiconductor device.

After that, as shown in FIG. 10, the insulating films IL1b and IL1a are etched with a photoresist film (not shown) serving as a mask where the formation regions of the plugs P1 are opened. This forms the contact holes C1. In the internal region of the second element formation region 2A, the contact holes C1 are formed on the source and drain regions (the n$^+$-type semiconductor regions NR and the p$^+$-type semiconductor regions PR) and the gate electrodes GE. In this way, the contact holes C1 are formed on the component parts (the source region, the drain region, and the gate electrode) of the transistors so as to expose the surface of the metal silicide layer SIL. The step of forming the deep trench DT2 may be performed after the step of forming the contact holes C1.

Figure 11:
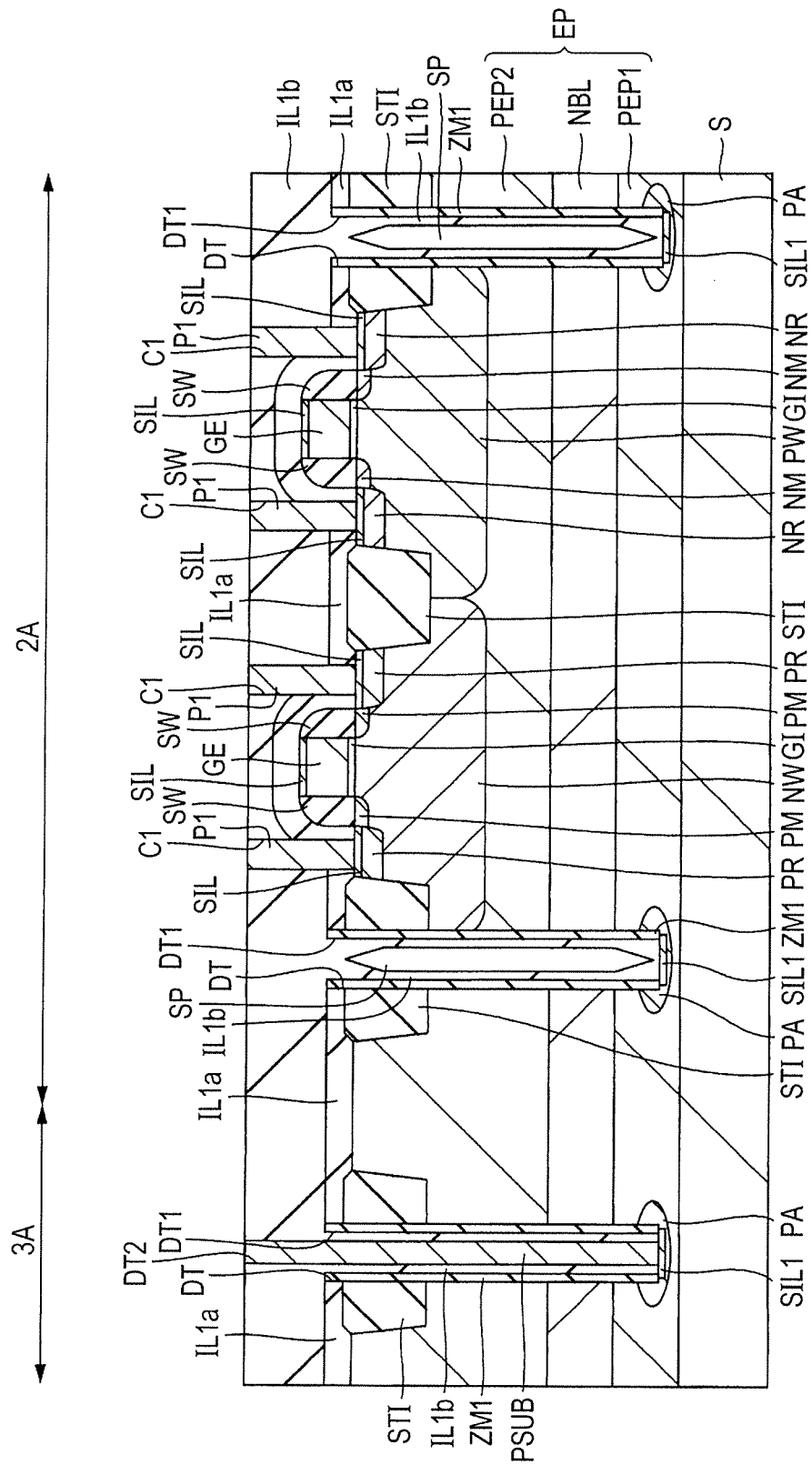
FIG. 11 is a cross-sectional view subsequent to FIG. 10 in the manufacturing process of the semiconductor device.
Figure 12:
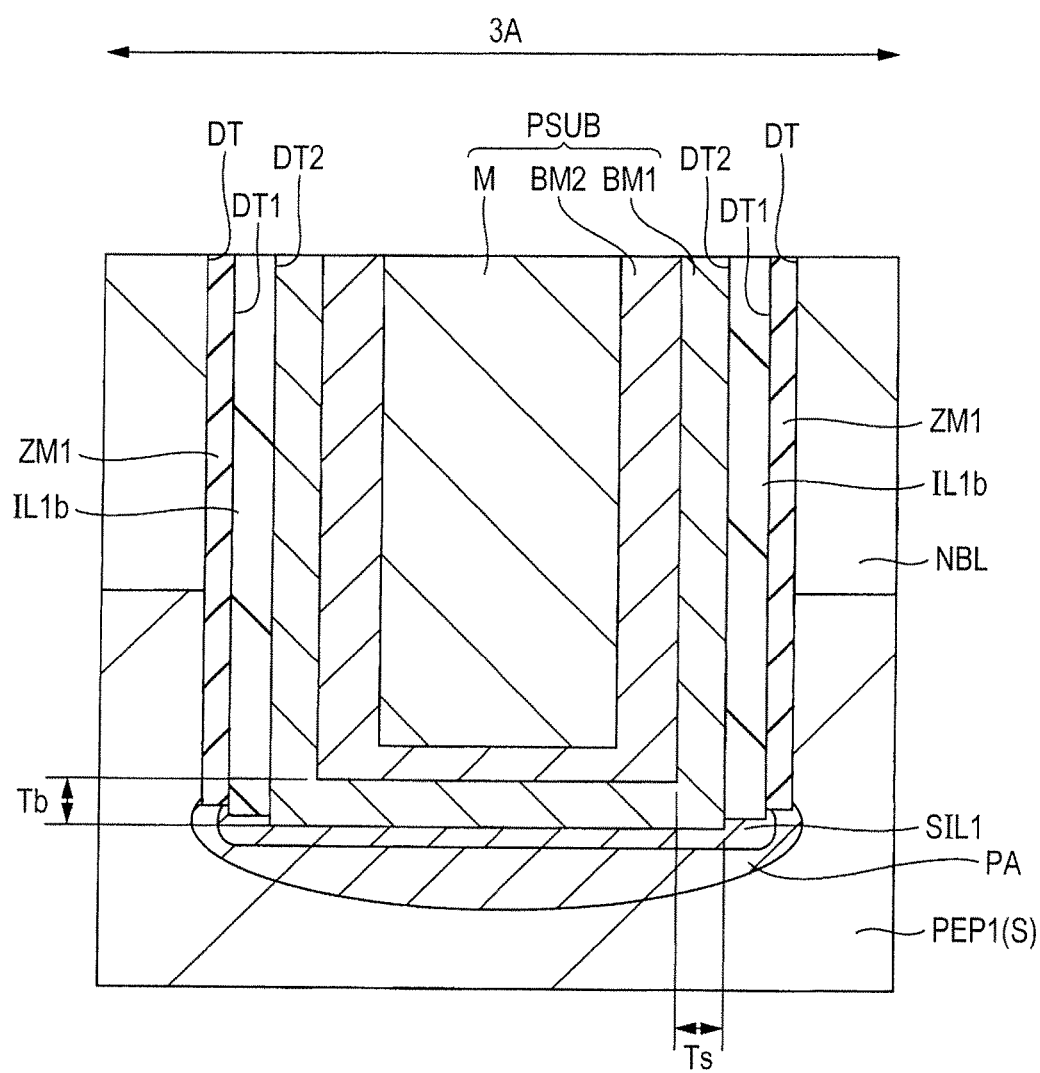
FIG. 12 is an enlarged cross-sectional view of a part X1 in FIG. 2.

Subsequently, as shown in FIG. 11, the deep trench DT2 and the contact holes C1 are filled with a conductor film (conductor) so as to form the plugs PSUB and P1. In other words, a conductive film is deposited on the insulating film IL1b including the deep trench DT2 and the contact holes C1, and then the unnecessary conductive film on the insulating film IL1b is removed by CMP or an etch back method. Specifically, a CVD-Ti film, a CVD-Tin film, and a CVD-W film are sequentially deposited and then the laminated film of these films undergoes CMP or the etch back method such that the upper part of the laminated film is removed to expose the major surface of the insulating film IL1b. This forms the plugs PSUB and P1, each having a laminated structure including the CVD-Ti film, the CVD-TiN film, and the CVD-W film. The CVD-Ti film at the bottom of the plug PSUB is in contact with the metal silicide layer SIL1 while the CVD-Ti film at the bottom of the plug P1 is in contact with the metal silicide layer SIL.

After that, as shown in FIG. 2, the wires M1 of the first layer are formed on the interlayer insulating film IL1 including the insulating film IL1a and the insulating film IL1b. For example, a barrier metal film including a TiN film and a Ti film and an Al film are deposited as conductive films on the interlayer insulating film IL1 by sputtering, and then the films are patterned so as to form the wires M1. The wire M1 may include a Ti film, a Ta film, a W film, or a nitride film including these films with a Cu film serving as a base barrier metal film. Moreover, second and subsequent wire layers (not shown) may be formed on the wires of the first layer.

The semiconductor device according to the present embodiment is manufactured thus.

Referring to FIG. 12, the structure of the bottom of the deep trench DT2 will be specifically described below. FIG. 12 is an enlarged cross-sectional view of the part X1 in FIG. 2.

As shown in FIG. 2, the deep trench DT is formed so as to penetrate the insulating film IL1a, the insulation region STI, the p-type epitaxial layer PEP2, and the n-type buried layer NBL from the major surface of the semiconductor substrate (S, PEP1, NBL, PEP2) and reach the inside of the p-type epitaxial layer PEP1. The plug PSUB is formed in the deep trench DT. On the side walls of the deep trench DT, the insulating film ZM1 is continuously formed from the top to the bottom of the deep trench DT. Since the insulating film ZM1 is formed so as to surround the deep trench DT, the side walls (inner walls) of the deep trench DT are completely covered with the insulating film ZM1. The insulating film ZM1 forms the deep trench DT1 having a smaller trench width than the deep trench DT.

The insulating film IL1b is formed on the side walls of the deep trench DT1 (that is, on the insulating film ZM1). Like the insulating film ZM1, the insulating film IL1b in the deep trench DT1 is continuously formed on the side walls of the deep trench DT1 from the top to the bottom of the deep trench DTI. Since the insulating film IL1b is formed so as to surround the deep trench DT1, the side walls (inner walls) of the deep trench DT1 are completely covered with the insulating film IL1b. The insulating film IL1b forms the deep trench DT2 having a smaller trench width than the deep trench DT1. In this configuration, the top (entrance) of the deep trench DT2 is the major surface (top surface) of the insulating film IL1b formed on the semiconductor substrate (S, PEP1, NBL, PEP2) and is higher than the tops (entrances) of the deep trenches DT and DT1. The plug PSUB is formed in the deep trench DT2. The plug PSUB is continuously formed from the top to the bottom of the deep trench DT2. The top of the plug PSUB is coupled to, for example, the wire M1 that supplies a ground potential, whereas the bottom of the plug PSUB is in contact with the metal silicide layer SIL1 and is electrically coupled to the p-type epitaxial layer PEP1 via the metal silicide layer SIL1 and the p-type impurity region PA. In other words, the ground potential of the wire M1 is supplied to the semiconductor substrate (S, PEP1) through the plug PSUB, the metal silicide layer SIL1, and the p-type impurity region PA.

In this example, the deep trenches DT, DT1, and DT2 and the plug PSUB are terminated in the p-type epitaxial layer PEP1 but may reach the support substrate S.

As shown in FIG. 12, the deep trench DTI is slightly deeper than the deep trench DT while the deep trench DT2 is slightly deeper than the deep trench DTI. This is because the deep trench DT, the deep trench DT1, and the deep trench DT2 are formed in this order and the silicon surface of the p-type epitaxial layer PEP1 exposed in the deep trench DT is etched during the formation of the deep trenches DT1 and DT2.

The p-type impurity region PA is implanted from the deep trench DT and spreads in the lateral and depth directions in the p-type epitaxial layer PEP1. Thus, the width of the p-type impurity region PA (the longest part in the lateral direction of FIG. 12) is larger than that of the deep trench DT (a distance between the inner walls of the deep trench DT in FIG. 12).

The metal silicide layer SIL1 formed in the deep trench DT1 spreads in the lateral and depth directions in the p-type epitaxial layer PEP1 and thus also extends under the insulating film ZM1 so as to be wider than the deep trench DT1. In other words, as shown in FIG. 12, the ends of the metal silicide layer SIL1 are located under the insulating film ZM1 and overlap the insulating film ZM1. The metal silicide layer SIL1 is surrounded by the p-type impurity region PA in the width and depth directions of the deep trench DT1 without protruding out of the p-type impurity region PA. Moreover, the metal silicide layer SIL1 is deeper than the bottom of the deep trench DT2 and spreads over the lower part of a first barrier metal film BM1. In other words, the bottom and sides (sides exposed from the insulating film IL1b) of the first barrier metal film BM1 are covered with the metal silicide layer SIL1.

The plug PSUB has a laminated film including the CVD-Ti film (first barrier metal film BM1), the CVD-TiN film (second barrier metal film BM2), and the CVD-W film (metal film M) that are sequentially stacked from the bottom (a side in contact with the metal silicide layer SIL1). For example, the CVD-Ti film has a thickness of 10 nm and the CVD-TiN film has a thickness of 5 to 10 nm. The CVD-W film is so thick as to fill the deep trench DT2. The thickness of the CVD-Ti film and the CVD-TiN film indicates the thickness of the bottom part (bottom) of the deep trench DT2. The CVD film has a smaller thickness on the side wall of the deep trench DT2 than at the bottom of the deep trench DT2. The thickness on the side wall is at least 0.8 times that at the bottom.

The CVD-Ti film is formed using, for example, $TiCl_4$ gas that is Ti compound gas. The CVD-TiN film is fort led using mixed gas of $TiCl_4$ gas and $N_2$. The CVD-W film is formed using $WF_6$ gas that is W compound gas. In this configuration, the CVD-Ti film can improve adhesion to the insulating film IL1b including the deep trench DT2 and can suppress a resistance increase caused by nitriding on the surface of the metal silicide layer SIL1 during the formation of the CVD-TiN film. The CVD-TiN film prevents a decrease in adhesion between the CVD-Ti film and the CVD-W film. If the CVD-W film is directly formed on the CVD-Ti film, the surface of the CVD-Ti film is fluorinated. Thus, the CVD-TiN film is interposed between the CVD-W film and the CVD-Ti film so as to prevent fluorination on the CVD-Ti film.

As shown in FIG. 12, in the present embodiment, the CVD-Ti film is formed after the formation of the metal silicide layer SIL1. Thus, a thickness Tb of the CVD-Ti film at the bottom of the deep trench DT2 is larger than a thickness Ts on one side of the deep trench DT2. Incidentally, in the formation of a metal silicide layer with the CVD-Ti film including the plug PSUB, the CVD-Ti film mostly changes to the metal silicide layer and thus the CVD-Ti film left at the bottom of the deep trench DT2 has a smaller thickness than the CVD-Ti film on one side of the deep trench DT2.

The first embodiment is characterized as follows:

In the following explanation, the wire M1, the plug PSUB, the metal silicide layer SIL1, and the p-type impurity region PA in the feeding region 3A will be collectively called "substrate contact".

The metal silicide layer SIL1 is formed on a silicon (p-type epitaxial layer PEP1) surface exposed at the bottom of the deep trench DT1, and then the plug PSUB is formed in the deep trench DT1, thereby stabilizing the substrate contact.

The metal film that forms the metal silicide layer SIL1 may be made of a material different from that of the metal film at the bottom of the plug PSUB, thereby reducing the resistance of the metal silicide layer SIL1.

The metal silicide layer SIL1 can be increased in thickness without depending on (regardless of) the thickness of the first barrier metal film BM1 of the plug PSUB. This can reduce the resistance of the substrate contact and reduce the thickness of the first barrier metal film BM1, thereby improving the embedding properties of the second barrier metal film BM2 and the metal film M of the plug PSUB.

In the step of forming the metal silicide layer SIL1, the unreacted metal film is removed from the bottom and sides of the deep trench DT2, and then the plug PSUB is formed. The formation of the metal silicide layer SIL1 does not reduce the aspect ratio of the deep trench DT2 for embedding the plug PSUB, thereby improving the embedding property of the plug PSUB. For example, the formation of a cavity in the CVD-W film can be prevented and the resistance of the plug PSUB can be reduced.

During the formation of the metal silicide layer SIL1, the deep trench DT1 is opened like a cavity, thereby reducing the occurrence of cracks on the insulating film ZM1 in the volume expansion of the metal film during the formation of the metal silicide layer SIL1 or the occurrence of crystal defects on the silicon layer of the p-type epitaxial layer PEP1. For example, when the metal silicide layer SIL1 is formed with the plug PSUB embedded in the deep trench DT2, the volume expansion of the metal film at that time may cause cracks or crystal defects.

The metal silicide layer SIL1 is formed using the metal film deposited by PVD such as sputtering, thereby providing the metal silicide layer SIL1 with a stable sheet resistance. When the metal film for forming the metal silicide layer SIL1 is deposited by CVD, the metal film contains impurities such as chlorine (Cl) and carbon (C, organic matter), making it difficult to properly form the metal silicide layer SIL1.

The CVD-Ti film formed at the bottom of the plug PSUB has a sufficient thickness at the bottom of the deep trench DT2, thereby preventing nitriding on the surface of the metal silicide layer SIL1 during the formation of the CVD-TiN film.

The p-type impurity region PA is formed using the deep trench DT, the metal silicide layer SIL1 is formed using the deep trench DT1 having a smaller width than the deep trench DT, and the plug PSUB is formed using the deep trench DT2 having a smaller width than the deep trench DT1. Specifically, the bottom of the plug PSUB can be covered with the metal silicide layer SIL1 and the bottom of the metal silicide layer SIL1 can be covered with the p-type impurity region PA. In other words, the metal silicide layer SIL1 is wider than the plug PSUB and the p-type impurity region PA is wider than the metal silicide layer SIL1. This can reduce the resistance of the substrate contact with stability. For example, in the case of a substrate contact where the bottom of the plug PSUB is not partially covered with the metal silicide layer SIL1, the substrate contact has a high resistance. In the case of the metal silicide layer SIL1 protruding out of the p-type impurity region PA, the resistance value of the metal silicide layer SIL1 may disadvantageously increase at the protrusion.

[Modification]

Figure 13:
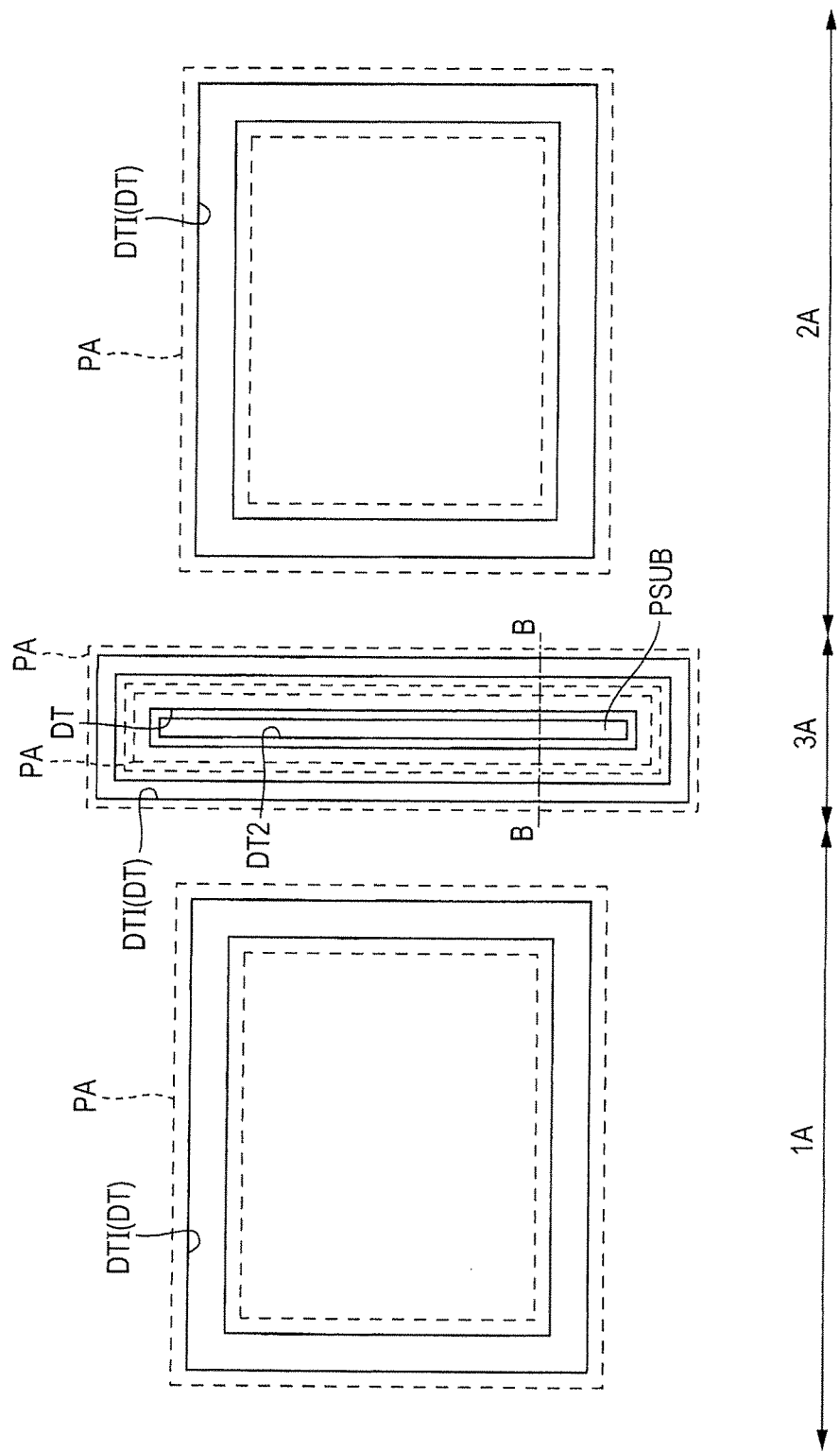
FIG. 13 is a plan view showing a semiconductor device according to a modification of FIG. 1.
Figure 14:
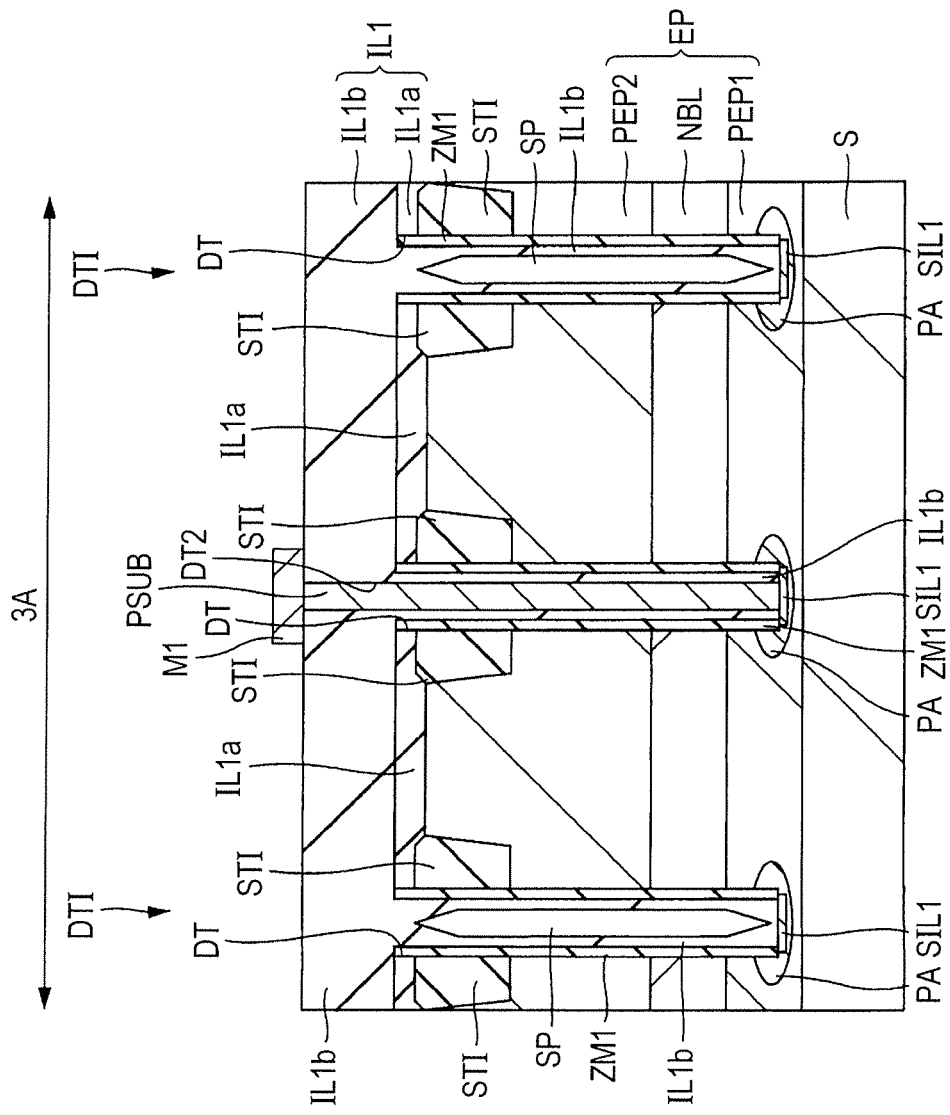
FIG. 14 is a cross-sectional view taken along line B-B of FIG. 13.

FIG. 13 is a plan view showing a semiconductor device according to a modification of FIG. 1. FIG. 14 is a cross-sectional view taken along line B-B of FIG. 13.

As shown in FIG. 13 or 14, in the feeding region 3A, the deep trench isolation DTI seamlessly (continuously) surrounds the periphery (circumference) of the plug PSUB of the substrate contact. The n-type buried layer NBL of the feeding region 3A is isolated from the n-type buried layers NBL of other regions (the first element formation region 1A and the second element formation region 2A) by the deep trench isolation DTI. Thus, even if cracks occurs on the insulating films ZM1 and IL1b of the feeding region 3A so as to cause a short circuit between the plug PSUB and the n-type buried layer NBL, the n-type buried layers NBL of the first element formation region 1A and the second element formation region 2A are not affected.

Second Embodiment

A second embodiment is a modification of the first embodiment. The second embodiment is different from the first embodiment in that a metal silicide layer is not formed at the bottom of a deep trench DT in deep trench isolation DTI. Accordingly, the manufacturing method is partially different from that of the first embodiment. The steps of the method will be discussed below.

FIGS. 15 to 19 are cross-sectional views showing the steps of manufacturing a semiconductor device according to the second embodiment. FIG. 20 is an enlarged cross-sectional view of a part X2 in FIG. 19.

[Explanation of the Manufacturing Method]

Figure 15:
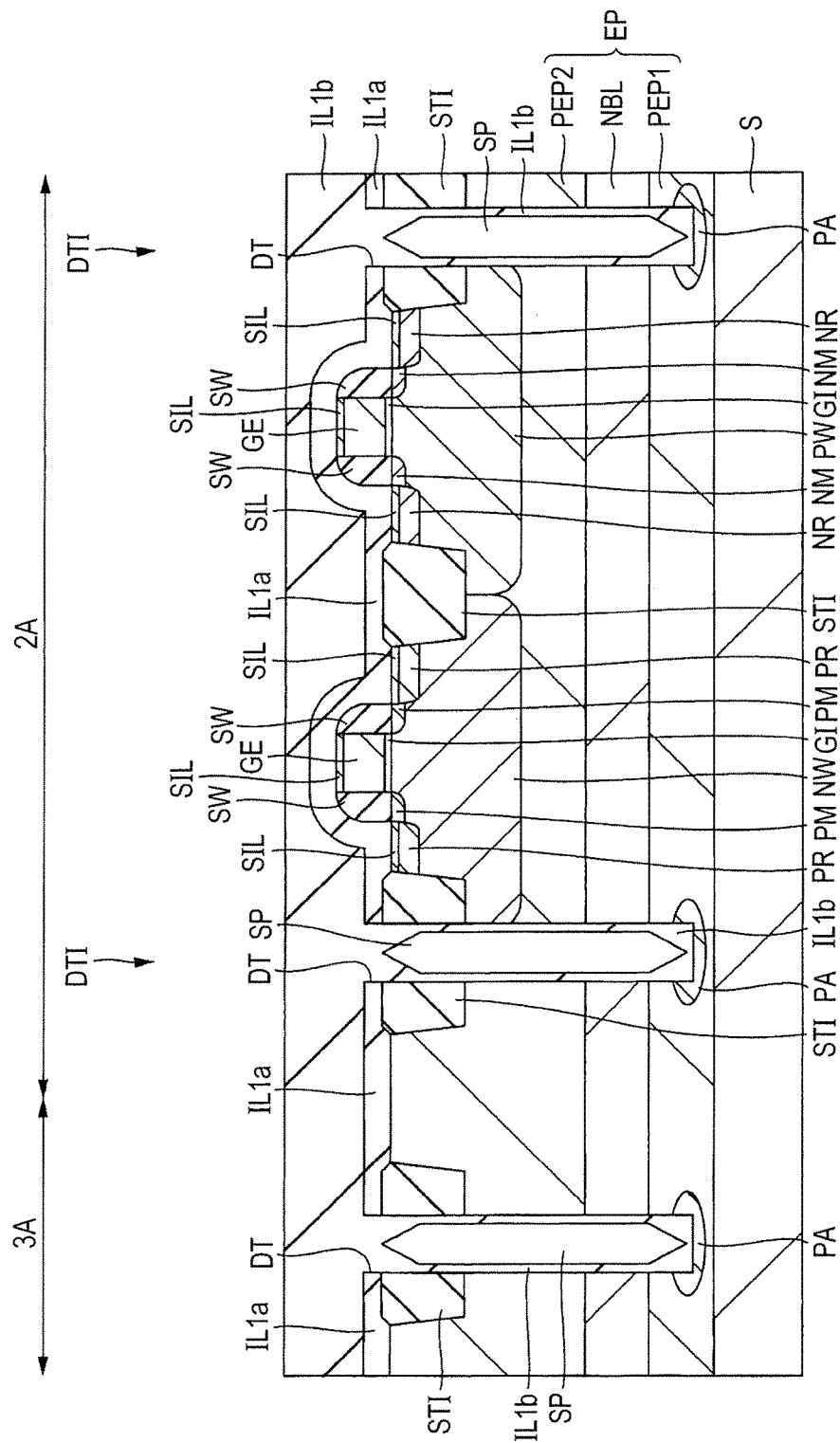
FIG. 15 is a cross-sectional view in the manufacturing process of a semiconductor device according to a second embodiment.

As shown in FIG. 15, an insulating film IL1b is formed subsequent to the steps of forming "the deep trenches DT" and forming "the p-type impurity regions PA" as shown in FIG. 5 according to the first embodiment. The insulating film IL1b is similar to that illustrated in FIG. 8 according to the first embodiment. The insulating film IL1b in the deep trench DT has a gap SP.

Figure 16:
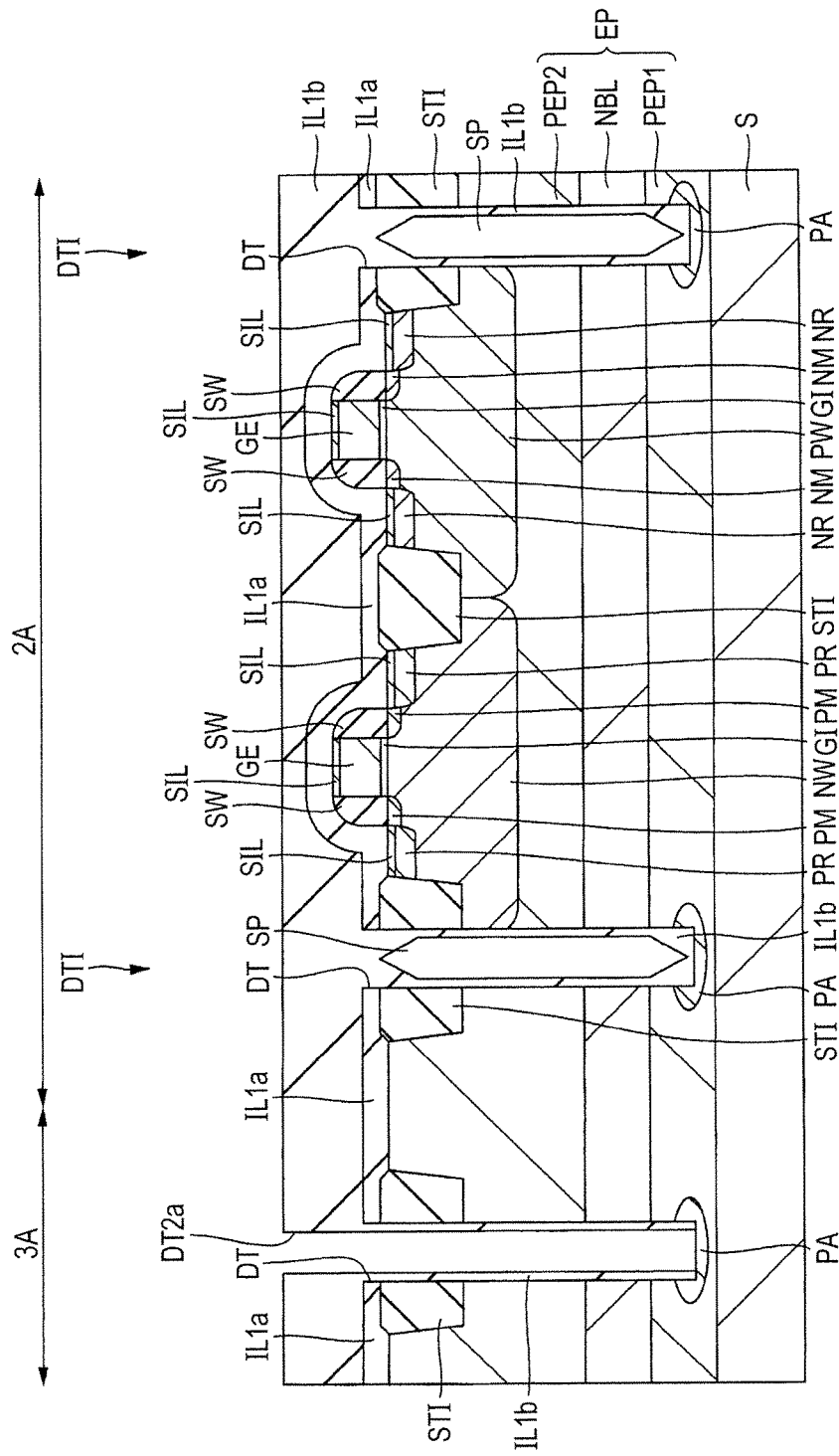
FIG. 16 is a cross-sectional view subsequent to FIG. 15 in the manufacturing process of the semiconductor device.

Subsequently, as shown in FIG. 16, the insulating film IL1b is etched with a photoresist film (not shown) serving as a mask where the formation region of a plug PSUB is opened in a feeding region 3A. Thus, a deep trench DT2a determined by the insulating film IL1b is formed in the deep trench DT. In this configuration, a p-type epitaxial layer PEP1 or a p-type impurity region PA is exposed at the bottom of the deep trench DT2a, whereas the side walls of the deep trench DT are covered with the insulating film IL1b and are not exposed in the deep trench DT2a. In other words, the deep trench DT2a has a smaller width than the deep trench DT and is located inside the deep trench DT.

Figure 17:
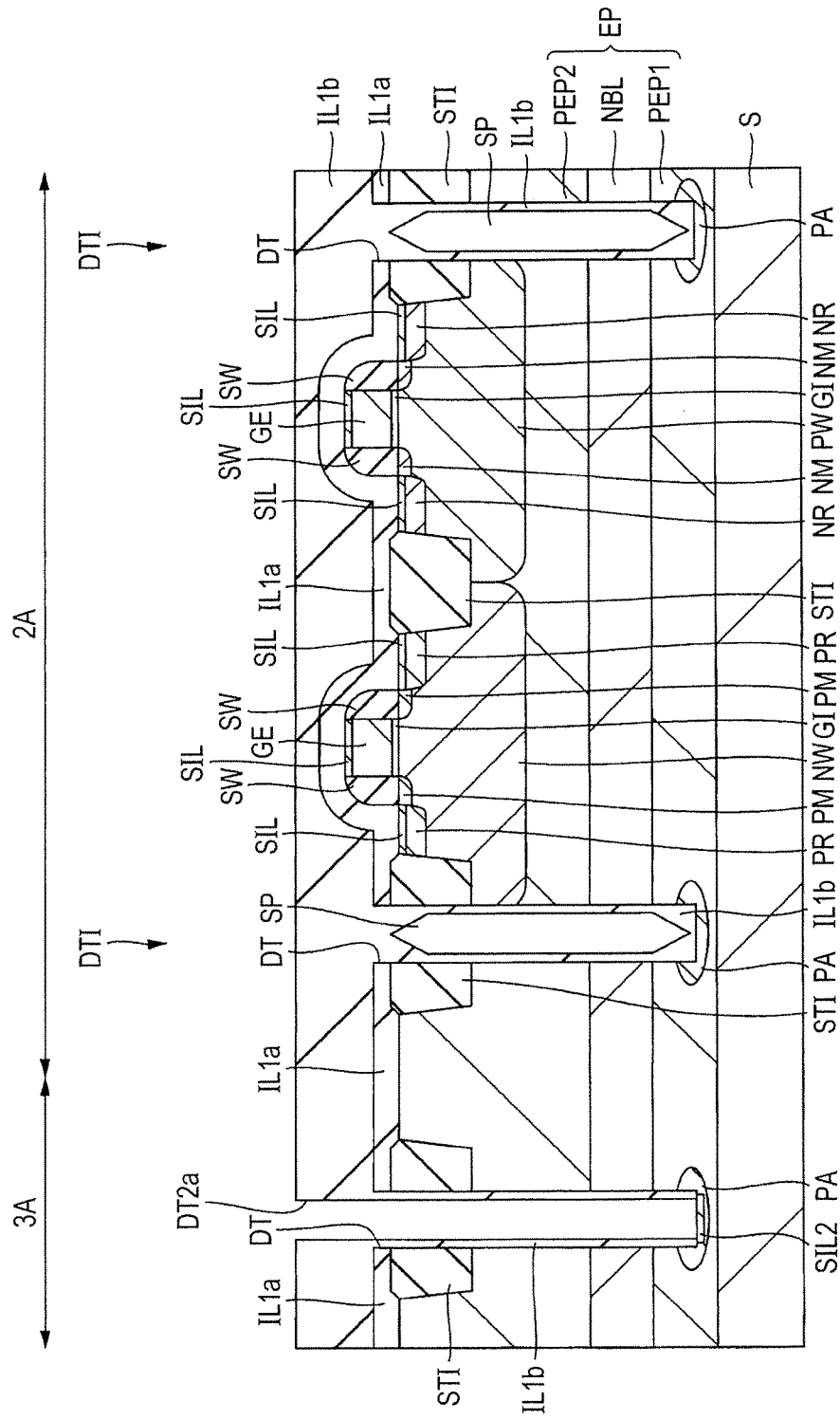
FIG. 17 is a cross-sectional view subsequent to FIG. 16 in the manufacturing process of the semiconductor device.

After that, as shown in FIG. 17, a metal silicide layer SIL2 is formed at the bottom of the deep trench DT2a in the p-type epitaxial layer PEP1 or the p-type impurity region PA. The metal silicide layer SIL2 is similar to the metal silicide layer SIL1 shown in FIG. 7 according to the first embodiment. As shown in FIG. 17, during the formation of the metal silicide layer SIL2, the deep trench DT of the deep trench isolation DTI is filled with the insulating film IL1b. Thus, the metal silicide layer SIL2 is formed at the bottom of the deep trench DT2a in the feeding region 3A but is not formed at the bottom of the deep trench DT in the deep trench isolation DTI.

Figure 18:
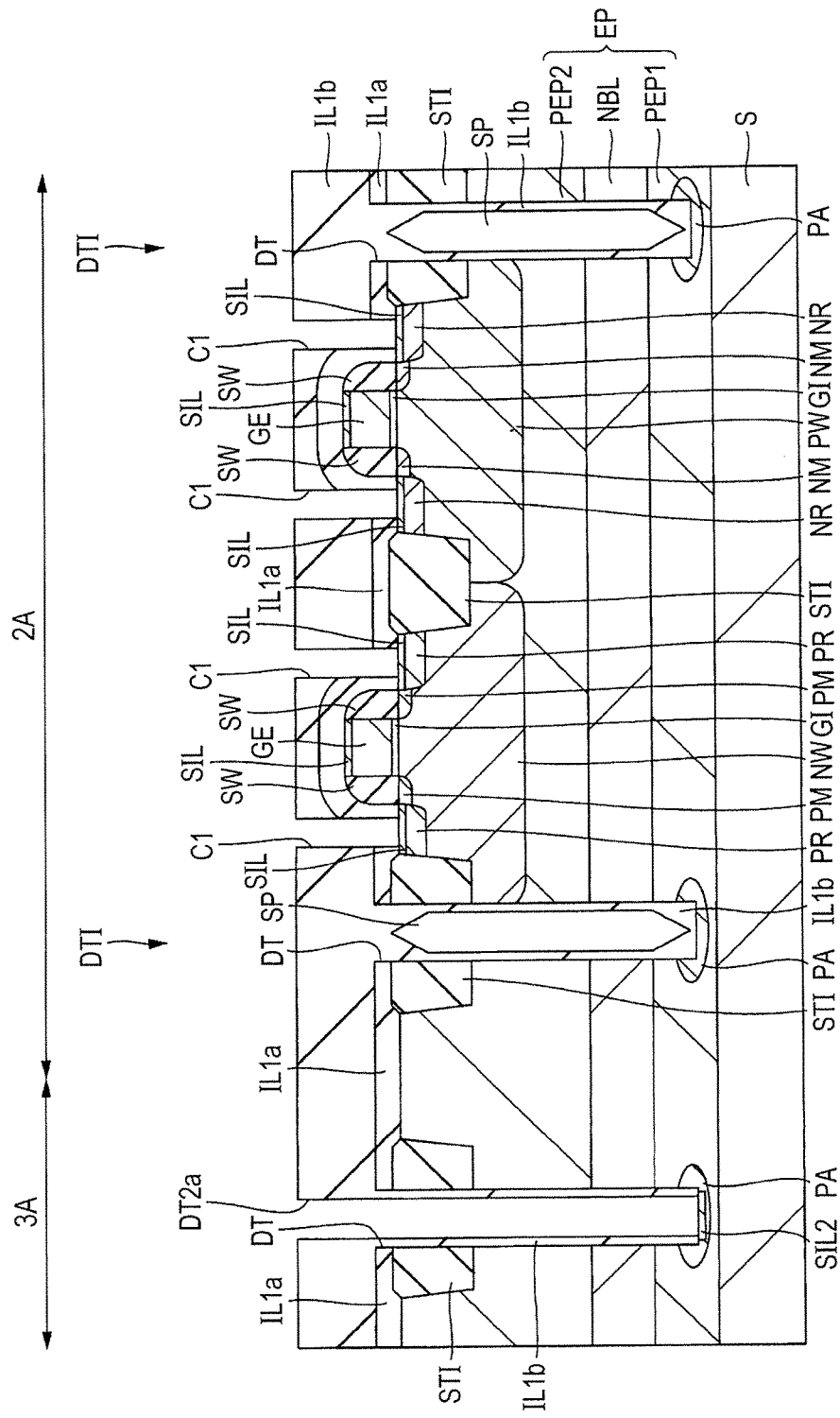
FIG. 18 is a cross-sectional view subsequent to FIG. 17 in the manufacturing process of the semiconductor device.

Subsequently, as shown in FIG. 18, the insulating film IL1b and an insulating film IL1a are etched as in the first embodiment with a photoresist film (not shown) serving as a mask where the formation regions of plugs P1 are opened. This forms contact holes Cl.

Figure 19:
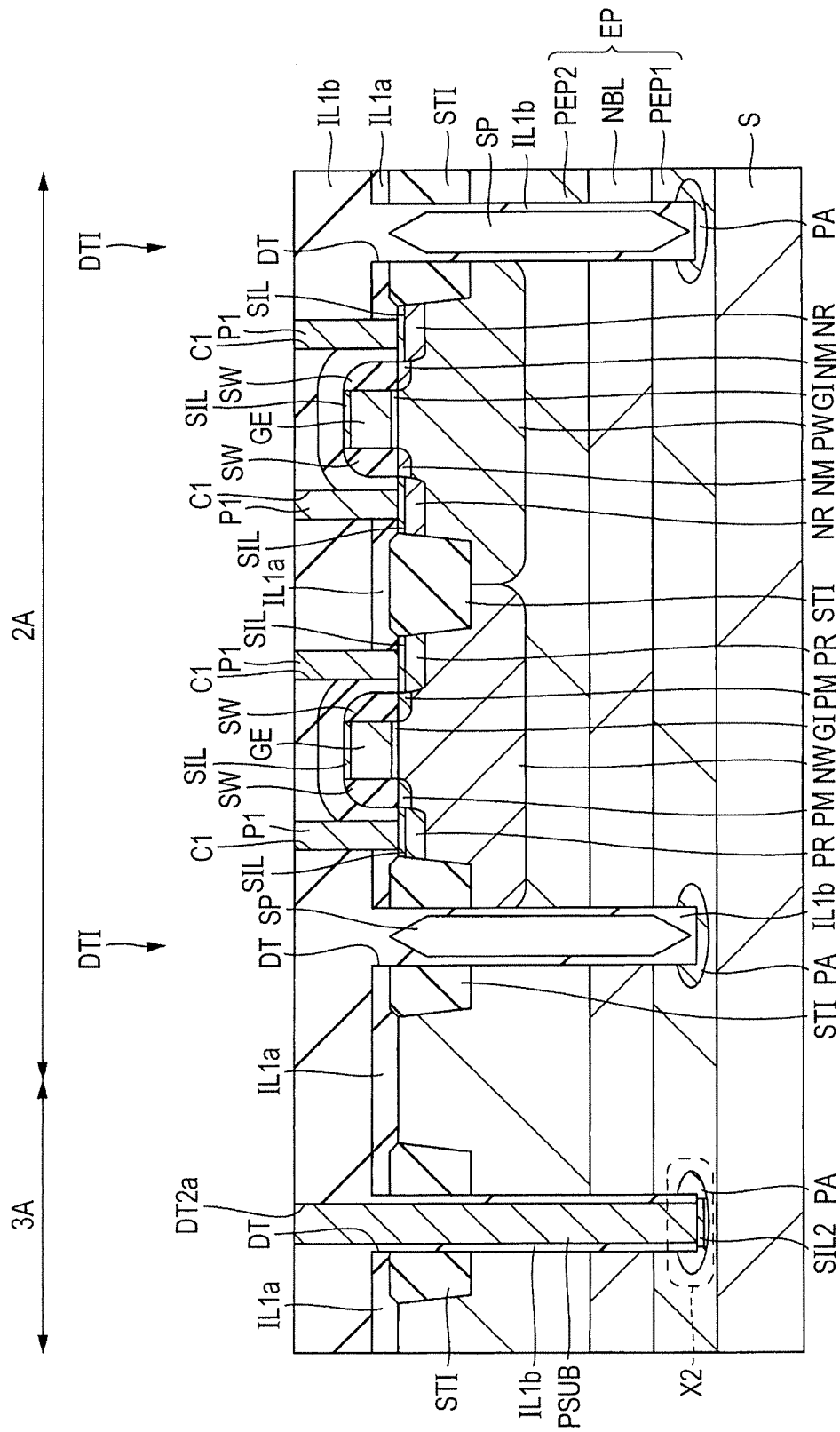
FIG. 19 is a cross-sectional view subsequent to FIG. 18 in the manufacturing process of the semiconductor device.
Figure 20:
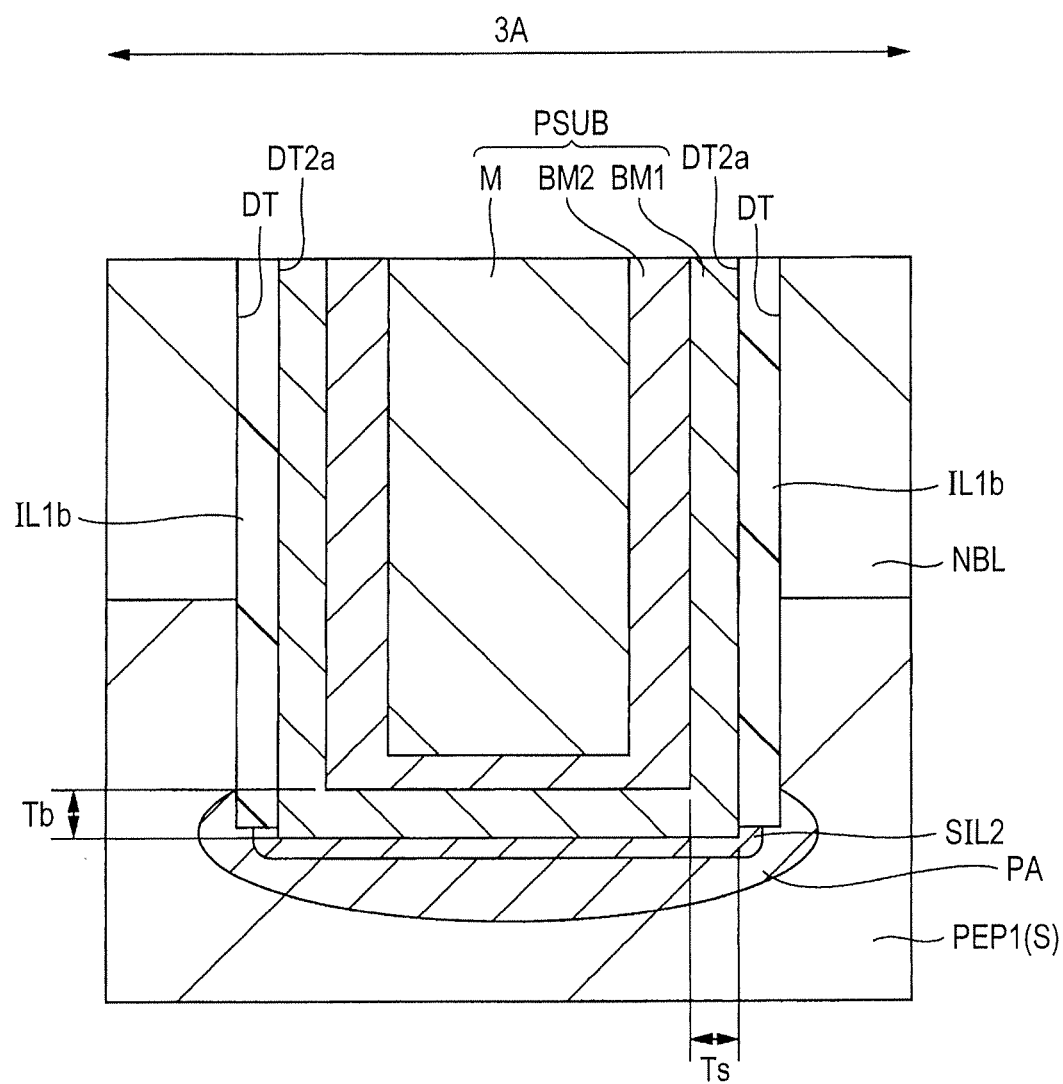
FIG. 20 is an enlarged cross-sectional view of a part X2 in FIG. 19.

After that, as shown in FIG. 19, a conductive film (conductor) is embedded in the deep trench DT2a and the contact holes Cl as in the first embodiment, forming the plugs PSUB and P1. Furthermore, wires M1 are formed as in the first embodiment, thereby fabricating the semiconductor device of the second embodiment.

As shown in FIG. 20, the substrate contact of the second embodiment is substantially identical in structure to that of the first embodiment. The second embodiment is different from the first embodiment in that the insulating film ZM1 is not interposed between the side walls of the deep trench DT and the insulating film IL1b. As in the first embodiment, the metal silicide layer SIL2 also extends under the insulating film IL1b so as to be wider than the deep trench DT2a. In other words, the ends of the metal silicide layer SIL2 are located under the insulating film IL1b and overlap the insulating film IL1b. Additionally, the relationship between the metal silicide layer SIL2 and the p-type impurity region PA and the depth of the metal silicide layer SIL2 are identical to those of the first embodiment. Moreover, a first barrier metal film BM1, a second barrier metal film BM2, and a metal film M are similar to those of the first embodiment.

According to the second embodiment, a metal silicide layer is not formed at the bottom of the deep trench isolation DTI, achieving the following effect:

For example, a leak can be prevented between a first element formation region 1A and a second element formation region 2A.

Third Embodiment

A third embodiment is a modification of the first embodiment. The third embodiment is different from the first embodiment in that a metal silicide layer is not formed at the bottom of a deep trench DT in deep trench isolation DTI. The steps of the manufacturing method, which is different from that of the second embodiment, will be discussed below.

Figure 21:
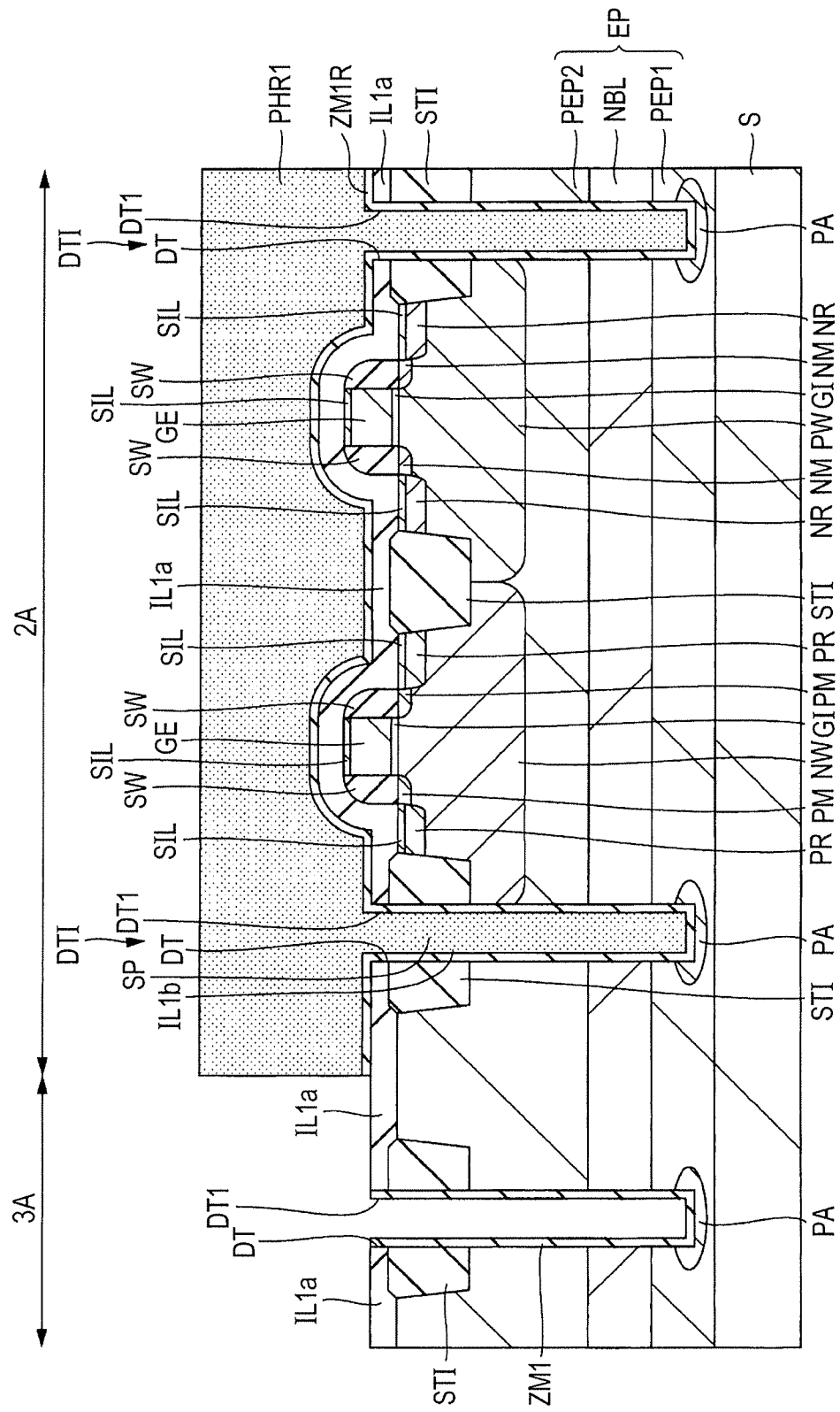
FIG. 21 is a cross-sectional view in the manufacturing process of a semiconductor device according to a third embodiment.
Figure 22:
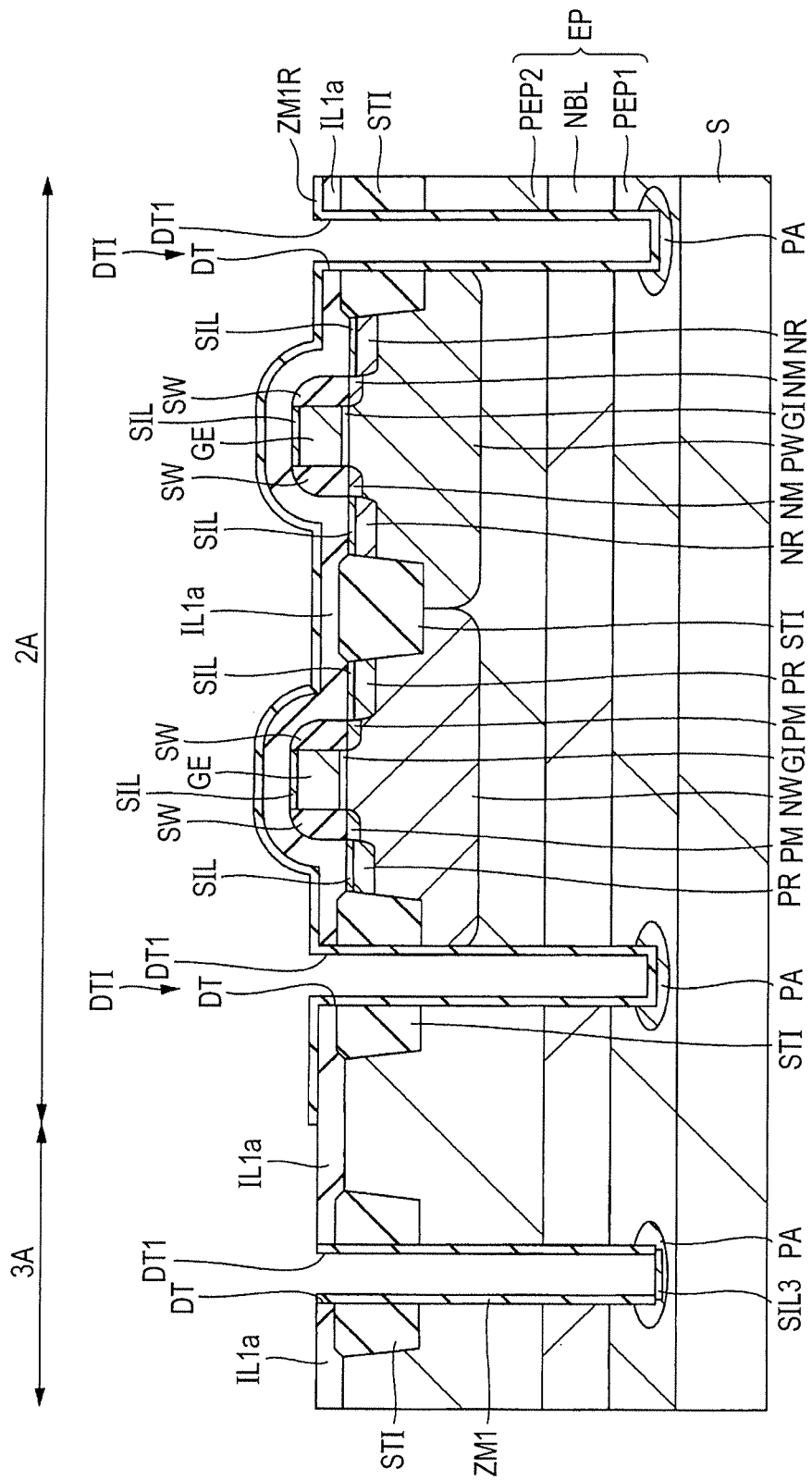
FIG. 22 is a cross-sectional view in the manufacturing process of the semiconductor device according to the third embodiment.

FIGS. 21 and 22 are cross-sectional views showing the steps of manufacturing a semiconductor device according to the third embodiment.

[Explanation of the Manufacturing Method]

As shown in FIG. 21, an insulating film ZM1 is selectively formed on the side walls of the deep trench DT in a feeding region 3A subsequent to the steps of forming "the deep trenches DT" and "p-type impurity regions PA" as shown in FIG. 5 according to the first embodiment. As illustrated in FIG. 6 of the first embodiment, for example, an insulating film including a silicon oxide film is deposited to form the insulating film ZM1 on a semiconductor substrate. In the third embodiment, a photoresist film PHR1 is formed on the insulating film so as to cover a second element formation region 2A and expose the feeding region 3A, anisotropic dry etching is performed on the insulating film of the feeding region 3A, the insulating film ZM1 is formed on the side walls of the deep trench DT of the feeding region 3A, and the bottom of the deep trench DT is exposed. Moreover, an insulating film ZM1R is left in the second element formation region 2A covered with the photoresist film PHR1. In other words, in the second element formation region 2A, the bottom of the deep trench DT of the deep trench isolation DTI is covered with the insulating film ZM1R. After that, the photoresist film PHR1 is removed.

Subsequently, as shown in FIG. 22, a metal silicide layer SIL3 is formed at the bottom of the deep trench DT1 of the feeding region 3A while the second element formation region 2A is covered with the insulating film ZM1R. The metal silicide layer SIL3 is similar to the metal silicide layer SIL1 of the first embodiment and is formed by the same method. At this point, a metal silicide layer is not formed at the bottom of the deep trench DT of the deep trench isolation DTI in the second element formation region 2A.

After that, steps subsequent to the step of forming "an insulating film IL1b" in FIG. 8 of the first embodiment are performed to manufacture the semiconductor device of the third embodiment.

Fourth Embodiment

A fourth embodiment will describe a manufacturing method including the step of forming a metal silicide layer on the source, the drain region, and the gate electrode of a CMOS transistor in a second element formation region 2A, and a metal silicide layer at the bottom of a deep trench DT in a feeding region 3A.

FIGS. 23 to 32 are cross-sectional views showing the steps of manufacturing a semiconductor device according to the fourth embodiment.

Figure 23:
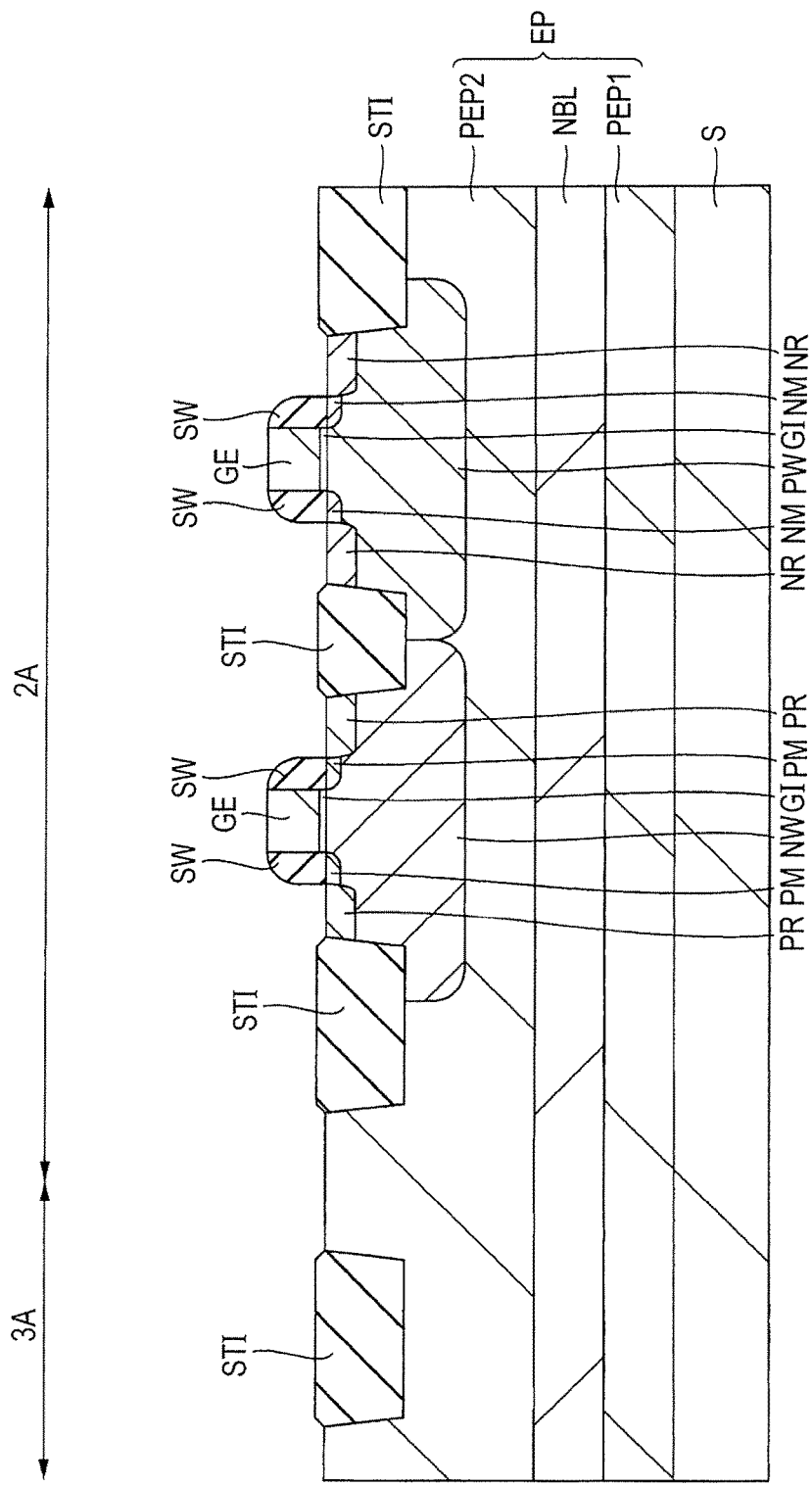
FIG. 23 is a cross-sectional view in the manufacturing process of a semiconductor device according to a fourth embodiment.

First, as shown in FIG. 23, the step of "preparing a semiconductor substrate having a CMOS transistor" is performed as in FIG. 4 of the first embodiment. At this point, however, the metal silicide layer is not formed on the source, the drain region, and the gate electrode of the CMOS transistor.

Figure 24:
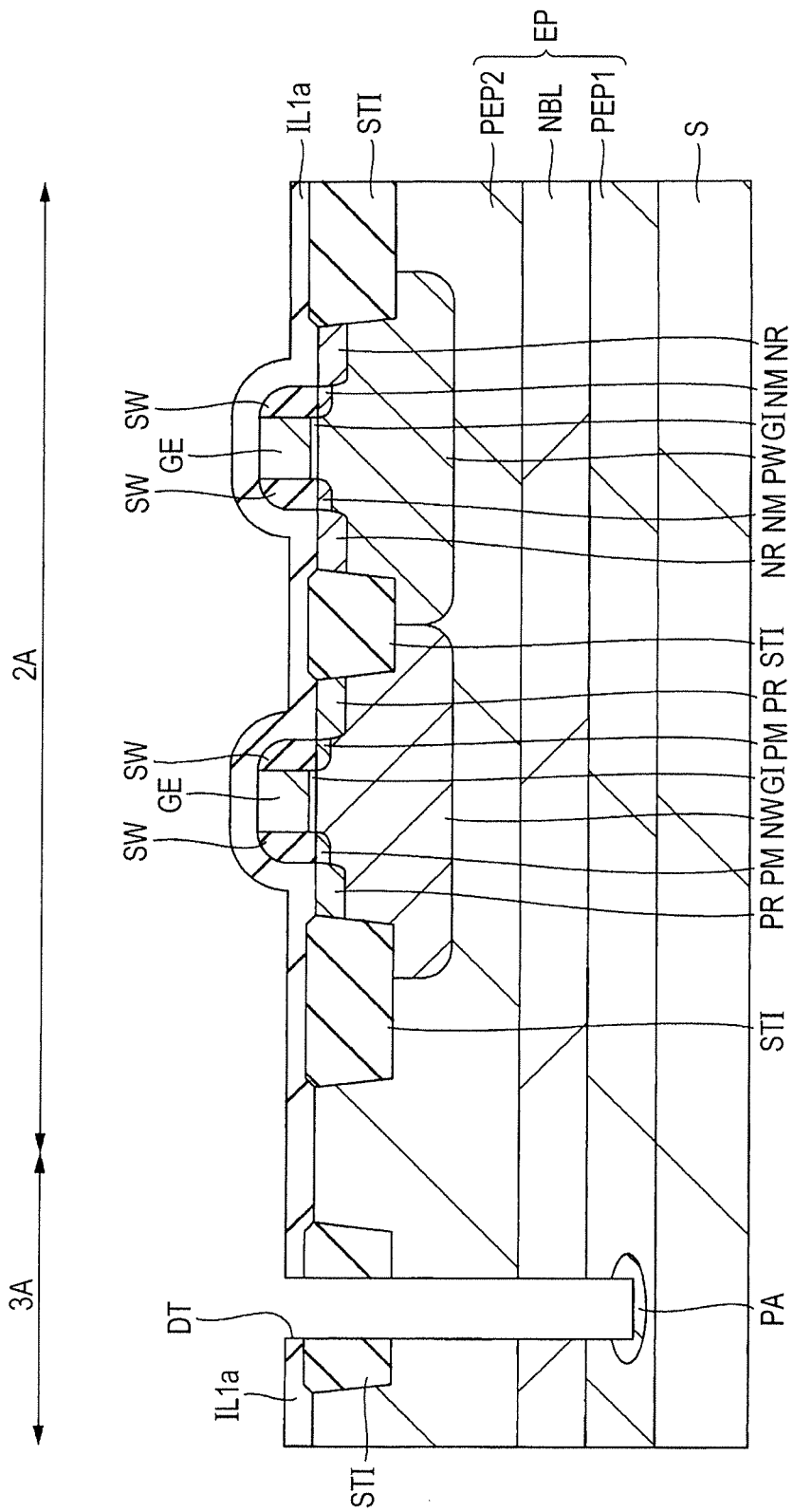
FIG. 24 is a cross-sectional view subsequent to FIG. 23 in the manufacturing process of the semiconductor device.

Subsequently, as shown in FIG. 24, the deep trench DT is formed only in a feeding region 3A and then a p-type impurity region PA is formed at the bottom of the deep trench DT. The deep trench DT and the p-type impurity region PA are formed as illustrated in FIG. 5 of the first embodiment.

Figure 25:
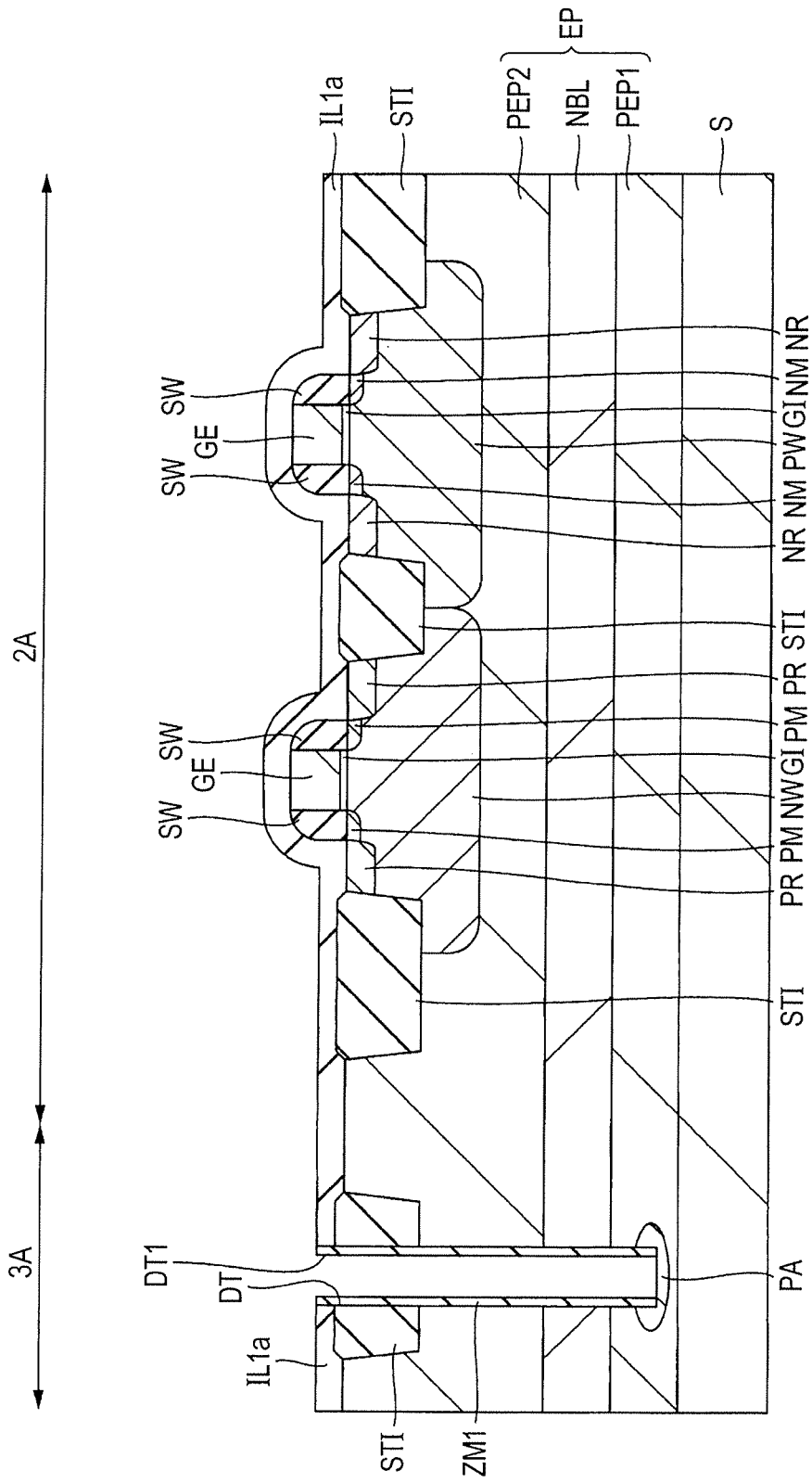
FIG. 25 is a cross-sectional view subsequent to FIG. 24 in the manufacturing process of the semiconductor device.

After that, as shown in FIG. 25, an insulating film ZM1 is formed on the side walls of the deep trench DT in the feeding region 3A. The formation of the insulating film ZM1 on the side walls of the deep trench DT forms a deep trench DT1 having a smaller width than the deep trench DT. The insulating film ZM1 is formed as illustrated in FIG. 6 of the first embodiment.

Figure 26:
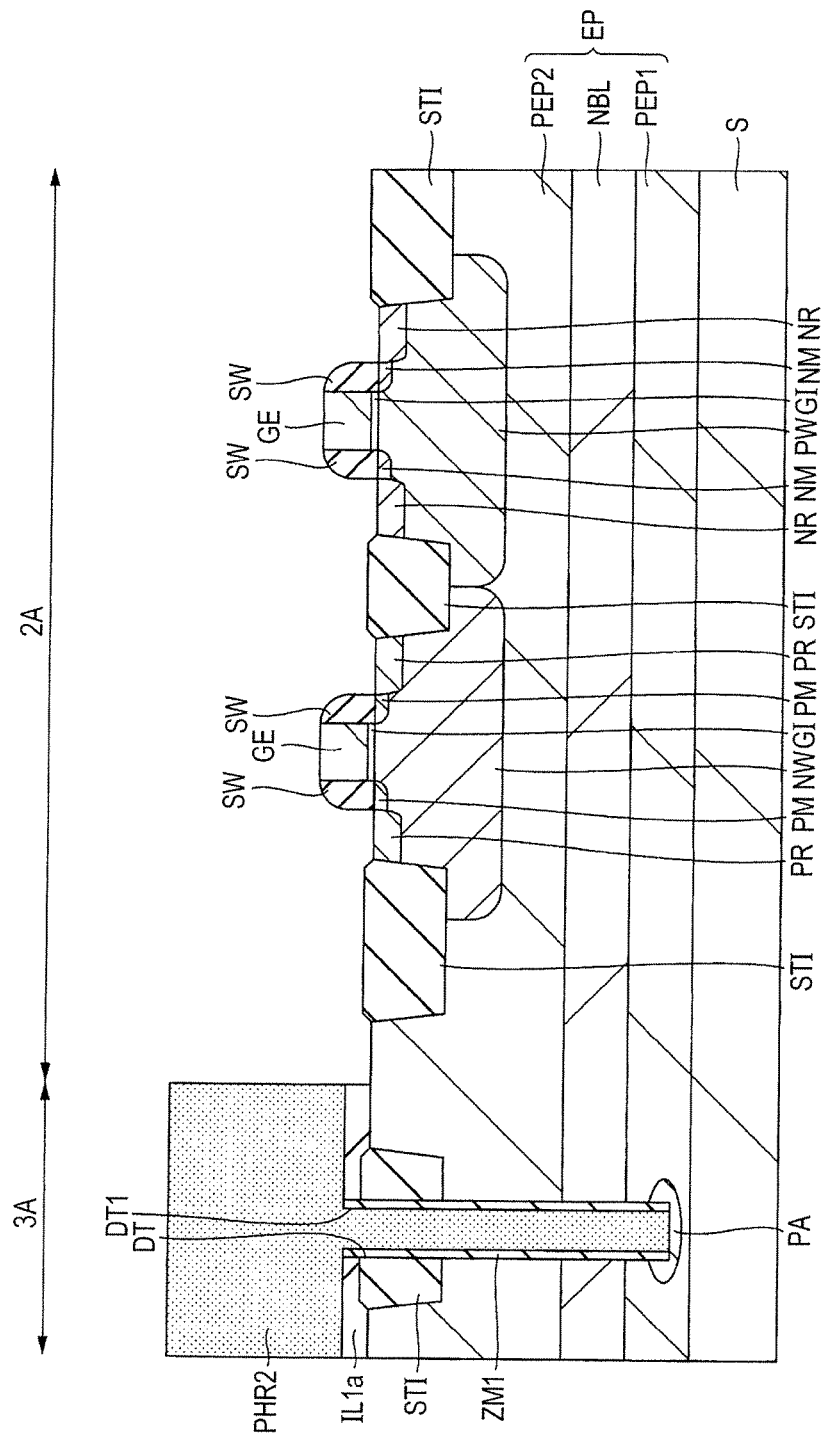
FIG. 26 is a cross-sectional view subsequent to FIG. 25 in the manufacturing process of the semiconductor device.

Subsequently, as shown in FIG. 26, an insulating film IL1a in the second element formation region 2A is removed using a photoresist film PHR2 that covers the feeding region 3A and exposes the second element formation region 2A. This exposes the source, the drain region, and the gate electrode of the CMOS transistor. The photoresist film PHR2 is then removed.

Figure 27:
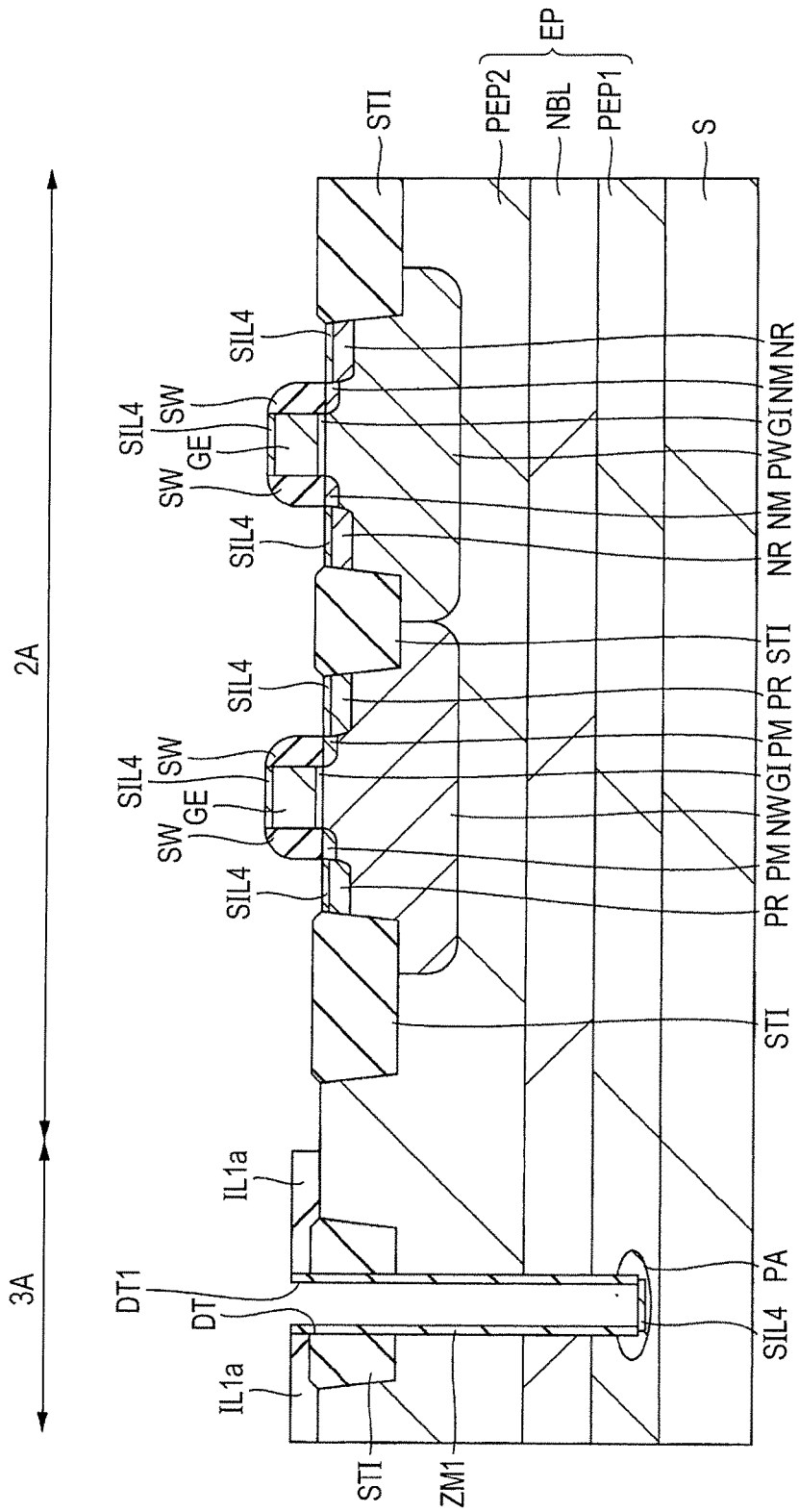
FIG. 27 is a cross-sectional view subsequent to FIG. 26 in the manufacturing process of the semiconductor device.

After that, as shown in FIG. 27, a metal silicide layer SIL4 is formed on a p-type epitaxial layer PEP1 exposed at the bottom of the deep trench DT1 or the p-type impurity region PA in the feeding region 3A. At the same time, in the second element formation region 2A, the metal silicide layer SIL4 is formed on the source, the drain region (specifically, a high-concentration n-type semiconductor region NR and a high-concentration p-type semiconductor region PR), and a gate electrode GE of the CMOS transistor. The metal silicide layer SIL4 is formed as the metal silicide layer SIL1 of the first embodiment.

Figure 28:
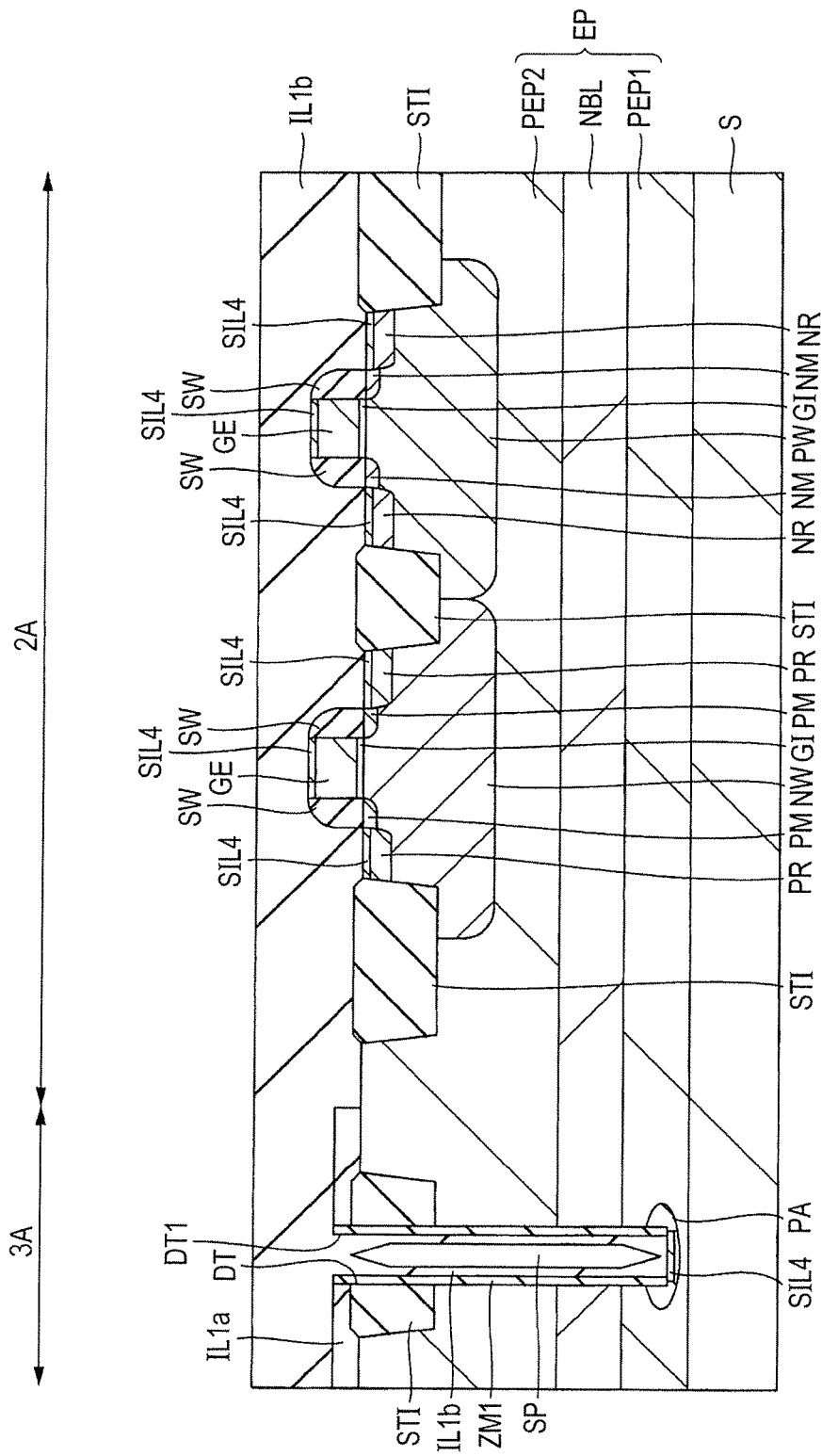
FIG. 28 is a cross-sectional view subsequent to FIG. 27 in the manufacturing process of the semiconductor device.

Subsequently, as shown in FIG. 28, an insulating film IL1b is formed as in the first embodiment. The insulating film IL1b covers the major surface of the semiconductor substrate and the side walls and bottom of the deep trench DT1 and has a gap SP at the center of the deep trench DT1.

Figure 29:
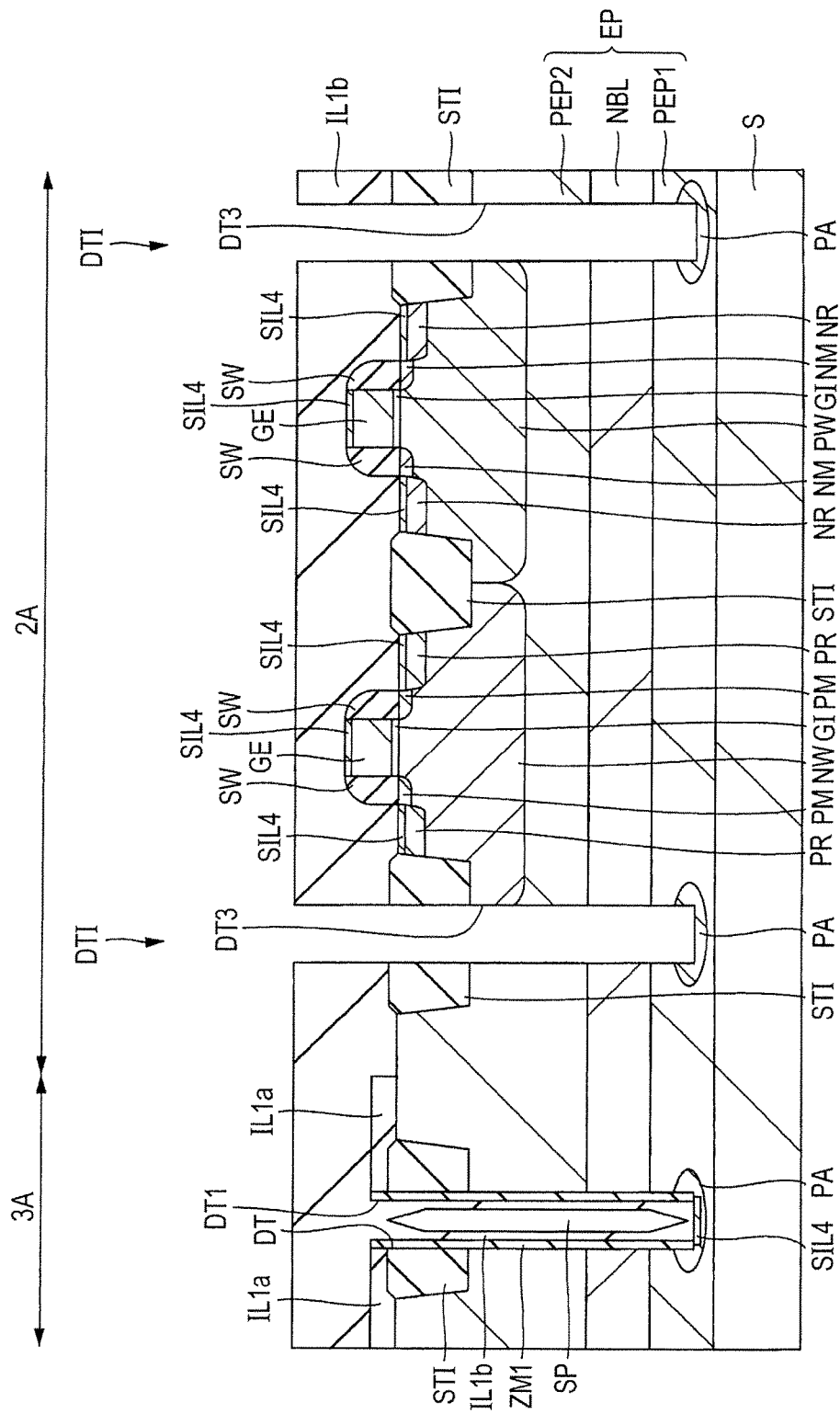
FIG. 29 is a cross-sectional view subsequent to FIG. 28 in the manufacturing process of the semiconductor device.

After that, as shown in FIG. 29, the insulating film IL1b, an insulation region STI, and the semiconductor substrate (a p-type epitaxial layer PEP2 and an n-type buried layer NBL) are etched with a photoresist film (not shown) serving as a mask where the formation region of the deep trench is opened in deep trench isolation DTI. This forms a deep trench DT3. The bottom of the deep trench DT3 penetrates the p-type epitaxial layer PEP2 and the n-type buried layer NBL and reaches, for example, the p-type epitaxial layer PEP1. Subsequently, a p-type impurity, e.g., boron (B) is implanted into the p-type epitaxial layer PEP1 exposed at the bottom of the deep trench DT3 formed in the second element formation region 2A, forming the p-type impurity region PA.

Figure 30:
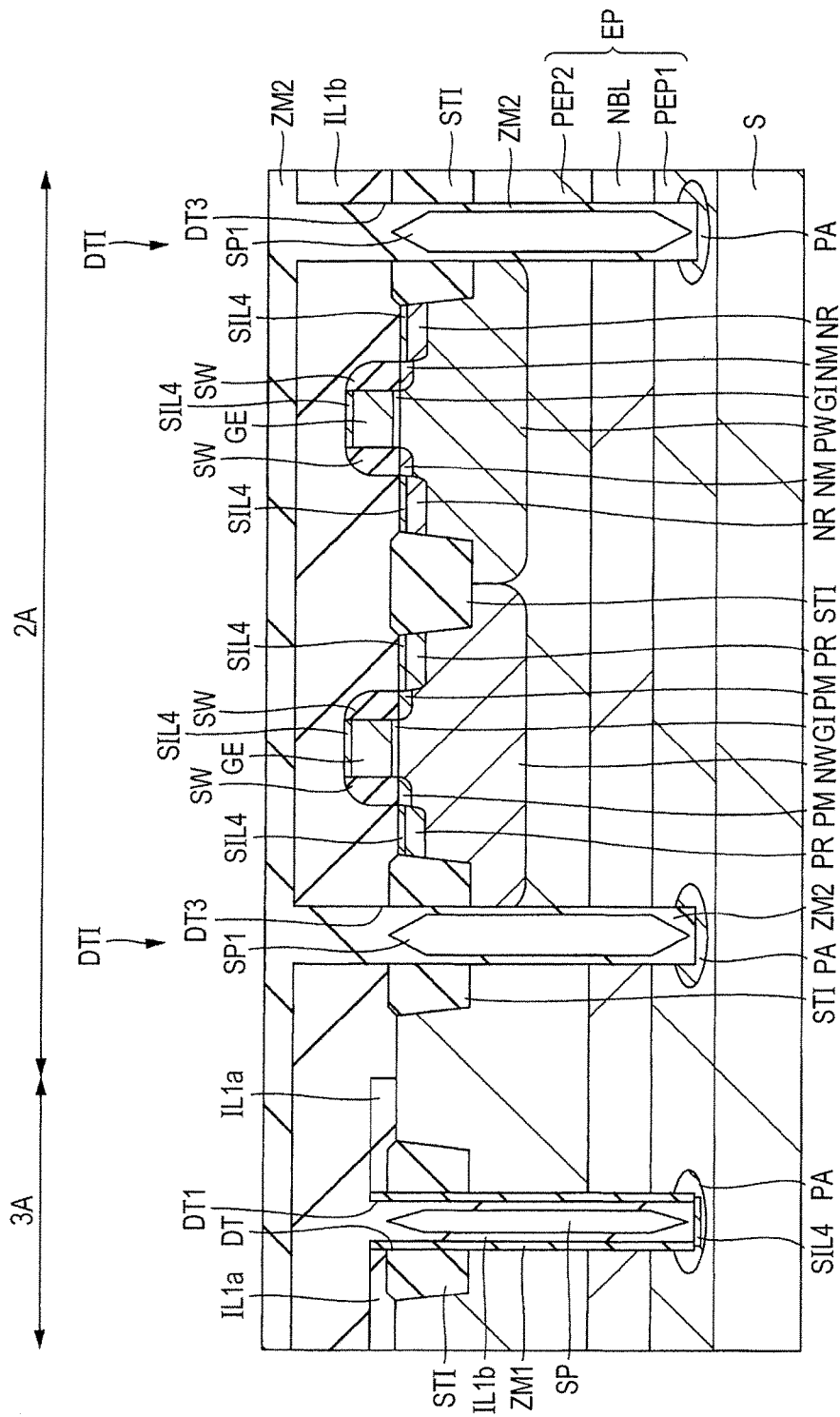
FIG. 30 is a cross-sectional view subsequent to FIG. 29 in the manufacturing process of the semiconductor device.

After that, as shown in FIG. 30, an insulating film, e.g., a silicon oxide film is deposited by, for example, CVD on the semiconductor substrate including the interior of the deep trench DT3. The insulating film is formed on the side walls and bottom of the deep trench DT3 with a gap SP1 formed at the center of the deep trench DT3. The upper part of the silicon oxide film is then planarized by, for example, CMP to form an insulating film ZM2.

Figure 31:
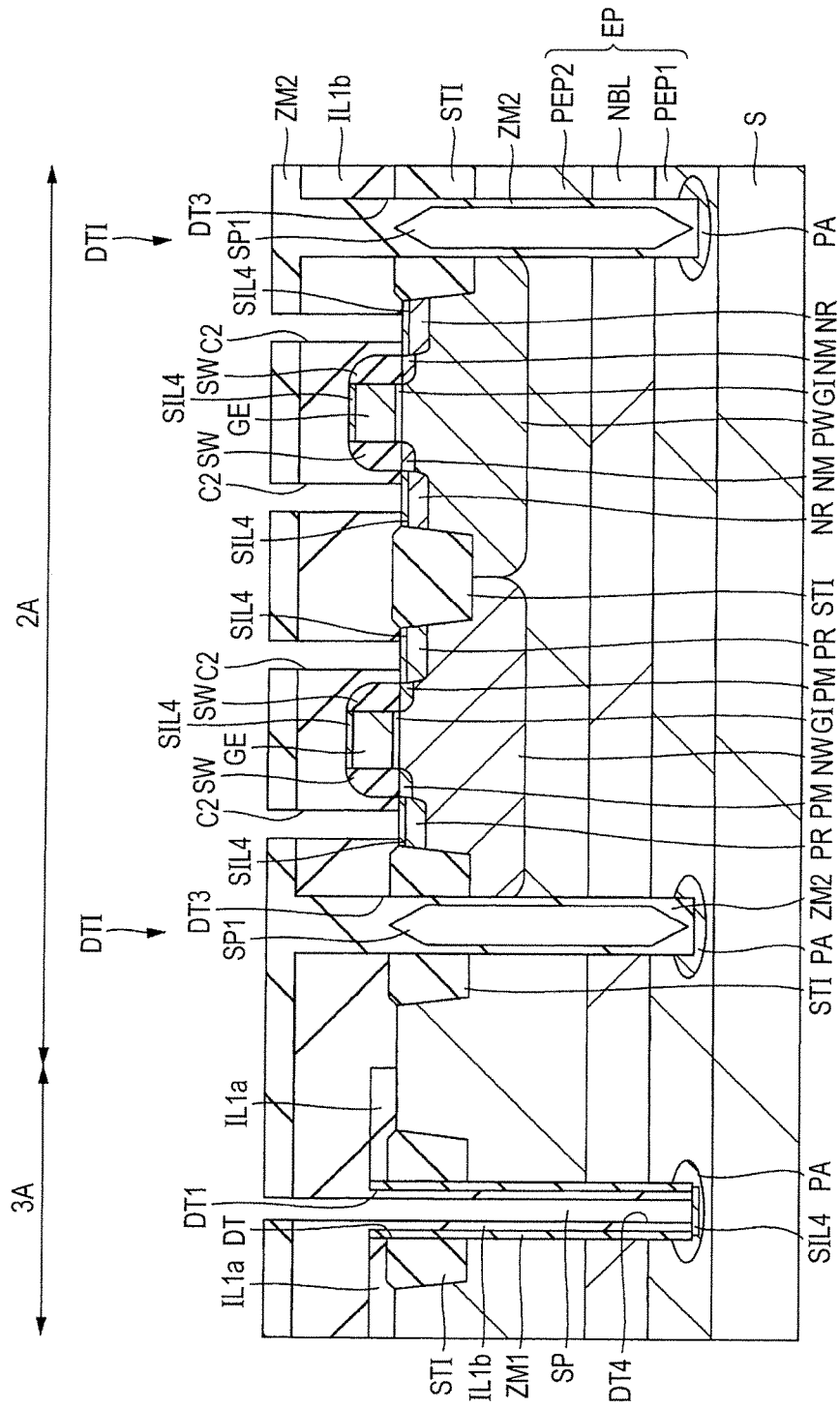
FIG. 31 is a cross-sectional view subsequent to FIG. 30 in the manufacturing process of the semiconductor device.

Subsequently, as shown in FIG. 31, a deep trench DT4 is formed in the feeding region 3A. The insulating films ZM2 and IL1b are etched with a photoresist film (not shown) serving as a mask where the formation region of a plug PSUB is opened in the feeding region 3A. This forms the deep trench DT4 determined by the insulating film IL1b in the deep trench DT1. After that, contact holes C2 are formed in the second element formation region 2A. The insulating films ZM2 and IL1b are etched with a photoresist film (not shown) serving as a mask where the formation regions of plugs P2 are opened in the second element formation region 2A. This forms the contact holes C2 that expose the source, the drain region, and the gate electrode of the CMOS transistor. The deep trench DT4 and the contact holes C2 may be formed simultaneously or at different times.

Figure 32:
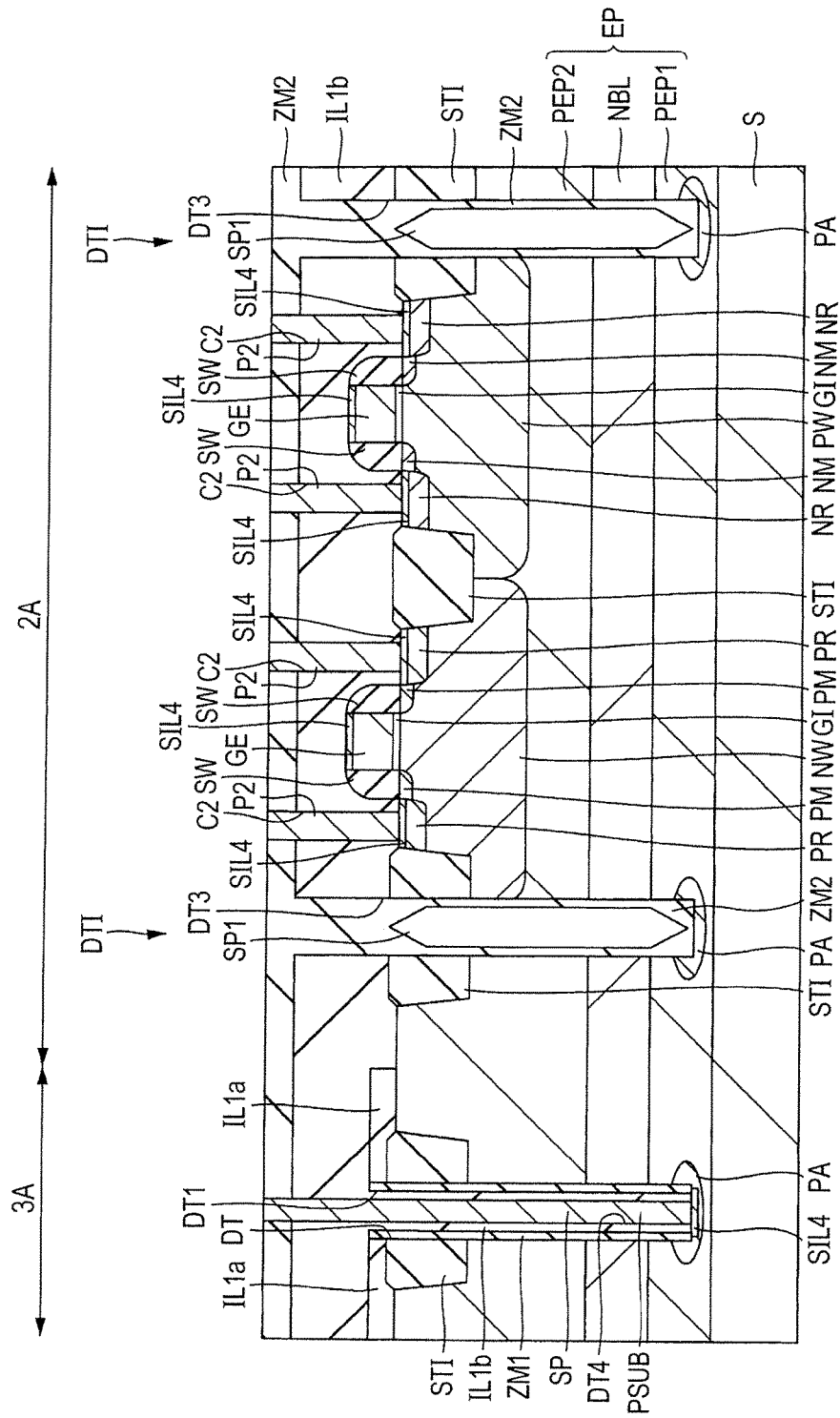
FIG. 32 is a cross-sectional view subsequent to FIG. 31 in the manufacturing process of the semiconductor device.

After that, as shown in FIG. 32, the plug PSUB is formed in the deep trench DT4 and the plugs P2 are formed in the contact holes C2. The plugs PSUB and P2 are formed like the plugs PSUB and P1 of the first embodiment. Moreover, wires M1 are formed according to the first embodiment, fabricating the semiconductor device according to the fourth embodiment.

According to the fourth embodiment, the metal silicide layer SIL4 on the source, the drain region, and the gate electrode of the CMOS transistor in the second element formation region 2A is formed in the same step as the metal silicide layer SIL4 at the bottom of the deep trench DT in the feeding region 3A. This can reduce a heat load to the CMOS transistor. In other words, the metal silicide layer can be formed in one step, thereby reducing heat treatment during the formation of the metal silicide layer. This allows finer designs for n-type MOS transistors and p-type MOS transistors.

The invention made by the present inventors was specifically described according to the foregoing embodiments. Obviously, the present invention is not limited to the embodiments and can be changed in various ways without departing from the scope of the invention.

For example, in the foregoing embodiments, the semiconductor substrate includes the epitaxial layer (n-type buried layer NBL) EP. The semiconductor substrate may include a thick insulating layer and the epitaxial layer EP may be arranged on the insulating layer (so-called silicon on insulator (SOI) wafer). In the case of an SOI substrate particularly including a thick insulating layer having a thickness of at least 2 μm, a deep plug PSUB is necessary. The substrate contacts configured according to the first to fourth embodiments can obtain a stable resistance.

In the foregoing embodiments, the LDMOS transistor was illustrated as an element formed in the first element formation region 1A. Any other elements to be isolated by the n-type buried layer NBL may be additionally provided. Such elements include a bipolar transistor and a diode.

A part of a description of the foregoing embodiments is presented below.

APPENDIX 1

A semiconductor device including:
a semiconductor substrate having a first p-type silicon layer, an n-type silicon layer on the first p-type silicon layer, and a second p-type silicon layer on the n-type silicon layer;
a MOS transistor formed on the second p-type silicon layer in a first region of the major surface of the semiconductor substrate, the MOS transistor having a gate electrode, a source region, and a drain region;
a first trench that penetrates, in a second region different from the first region, the second p-type silicon layer and the n-type silicon layer from the major surface of the semiconductor substrate and reaches the first p-type silicon layer;
a silicide layer formed on the surface of the first p-type silicon layer at the bottom of the first trench, the silicide layer including a first metal film; and a plug electrode including a second metal film formed in the first trench so as to be in contact with the silicide layer, the first metal film being different from the second metal film.

APPENDIX 2

In the semiconductor device according to appendix 1, the second metal film is a titanium film and the first metal film is a cobalt film or a nickel film.

APPENDIX 3

In the semiconductor device according to appendix 1, the second metal film is formed on the side walls and bottom of the first trench and has a larger thickness at the bottom than on the side walls.

APPENDIX 4

The semiconductor device according to appendix 1 further includes, at the bottom of the first trench, a p-type semiconductor region surrounding the silicide layer in plan view.

APPENDIX 5

The semiconductor device according to appendix 1 further includes a first insulating film arranged between the side walls of the first trench and the plug electrode, the silicide layer overlapping the first insulating film in cross section.

APPENDIX 6

The semiconductor device according to appendix 1 further includes: a second trench that surrounds the MOS transistor in the first region in plan view and penetrates the second p-type silicon layer and the n-type silicon layer from the major surface of the semiconductor substrate so as to reach the first p-type silicon layer; and a second insulating film that covers the MOS transistor and fills the second trench, the second insulating film having a gap in the second trench.

What is claimed is:

1. A method of manufacturing a semiconductor device, comprising the steps of:
   (a) preparing a semiconductor substrate having a first p-type silicon layer, an n-type silicon layer over the first p-type silicon layer, and a second p-type silicon layer over the n-type silicon layer;
   (b) forming a MOS transistor over the second p-type silicon layer in a first region of a major surface of the semiconductor substrate, the MOS transistor having a gate electrode, a source region, and a drain region;
   (c) forming a trench that penetrates, in a second region different from the first region, the second p-type silicon layer and the n-type silicon layer and reaches the first p-type silicon layer;
   (d) forming a silicide layer over the first p-type silicon layer exposed at a bottom of the trench, the silicide layer including a first metal film; and
   (e) forming a plug electrode in the trench,
   wherein the step (d) includes steps of:
   (d-1) forming the first metal film over the first p-type silicon layer by PVD;
   (d-2) heat-treating the semiconductor substrate so as to form the silicide layer including the first metal film, and
   (d-3) removing the first metal film that has not reacted to form the silicide layer.

2. The method of manufacturing a semiconductor device according to claim 1,
   wherein the step (e) includes the step of (e-1) forming a titanium film over the silicide layer by CVD such that the titanium film is in contact with the silicide layer.

3. The method of manufacturing a semiconductor device according to claim 2,
   wherein after the step (e-1), the step (e) further includes the steps of:
   (e-2) forming a titanium nitride film over the titanium film, and
   (e-3) forming a tungsten film over the titanium nitride film.

4. The method of manufacturing a semiconductor device according to claim 1, further comprising the step of:
   (f) forming, between the step (c) and the step (d), a p-type semiconductor region over the first p-type silicon layer exposed at the bottom of the trench.

5. The method of manufacturing a semiconductor device according to claim 4, further comprising the step of:
   (g) forming, between the step (f) and the step (d), a first insulating film over side walls of the trench so as to expose the p-type semiconductor region at the bottom of the trench.

6. The method of manufacturing a semiconductor device according to claim 5, further comprising the step of:
   (h) forming, between the step (d) and the step (e), a second insulating film over the first insulating film so as to expose the silicide layer at the bottom of the trench.

7. A method of manufacturing a semiconductor device, comprising the steps of:
   (a) preparing a semiconductor substrate having a first p-type silicon layer, an n-type silicon layer over the first p-type silicon layer, and a second p-type silicon layer over the n-type silicon layer;
   (b) forming a MOS transistor over the second p-type silicon layer in a first region of a major surface of the semiconductor substrate, the MOS transistor having a gate electrode, a source region, and a drain region;
   (c) forming a first trench surrounding the MOS transistor in the first region in plan view and a second trench in a second region different from the first region such that the first and second trenches penetrate the second p-type silicon layer and the n-type silicon layer from the major surface of the semiconductor substrate and reach the first p-type silicon layer;
   (d) forming a first insulating film over side walls of the second trench so as to expose the first p-type silicon layer at a bottom of the second trench;
   (e) forming a silicide layer over the first p-type silicon layer exposed at the bottom of the second trench, the silicide layer including a first metal film;
   (f) forming a second insulating film over the semiconductor substrate so as to fill the first trench and the second trench;
   (g) forming a first opening at the second insulating film so as to expose a major surface of the silicide layer in the second trench; and
   (h) forming a first plug electrode in the first opening.

8. The method of manufacturing a semiconductor device according to claim 7,
   wherein the step (e) includes the steps of:
   (e-1) forming the first metal film over the first p-type silicon layer by PVD;

(e-2) heat-treating the semiconductor substrate so as to form the silicide layer including the first metal film, and (e-3) removing the first metal film that has not reacted to form the silicide layer.

9. The method of manufacturing a semiconductor device according to claim 7, wherein the step (h) includes the step of (h-1) forming a titanium film over the silicide layer by CVD such that the titanium film is in contact with the silicide layer.

10. The method of manufacturing a semiconductor device according to claim 9, wherein after the step (h-1), the step (h) further includes the steps of:

(h-2) forming a titanium nitride film over the titanium film; and (h-3) forming a tungsten film over the titanium nitride film.

11. The method of manufacturing a semiconductor device according to claim 7, further comprising the step of:

(i) forming, between the step (c) and the step (d), a p-type semiconductor region over the first p-type silicon layer exposed at the bottom of the second trench.

12. The method of manufacturing a semiconductor device according to claim 7, wherein in the step (f), the second insulating film has a gap in the first trench.

13. The method of manufacturing a semiconductor device according to claim 7, wherein in the step (d), the first insulating film is also formed over side walls of the first trench so as to expose the first p-type silicon layer at a bottom of the first trench.

14. The method of manufacturing a semiconductor device according to claim 7, wherein in the step (d), the first insulating film covers a bottom of the first trench without exposing the first p-type silicon layer.

15. The method of manufacturing a semiconductor device according to claim 7, wherein the step (g) includes the step of forming a second opening at the second insulating film so as to expose the source region and the drain region.

16. The method of manufacturing a semiconductor device according to claim 15, wherein the step (h) further includes the step of forming a second plug electrode in the second opening.

17. A method of manufacturing a semiconductor device, comprising the steps of:

(a) preparing a semiconductor substrate having a first p-type silicon layer, an n-type silicon layer over the first p-type silicon layer, and a second p-type silicon layer over the n-type silicon layer;

(b) forming a MOS transistor over the second p-type silicon layer in a first region of a major surface of the semiconductor substrate, the MOS transistor having a gate electrode, a source region, and a drain region;

(c) forming a first trench surrounding the MOS transistor in the first region in plan view and a second trench in a second region different from the first region such that the first and second trenches penetrate the second p-type silicon layer and the n-type silicon layer from the major surface of the semiconductor substrate and reach the first p-type silicon layer;

(d) forming an insulating film over the semiconductor substrate so as to fill the first trench and the second trench, the insulating film having a gap in each of the first trench and the second trench;

(e) forming an opening at the insulating film so as to expose the first p-type silicon layer in the second trench;

(f) forming a silicide layer over the first p-type silicon layer exposed from the opening, the silicide layer including a metal film; and (g) forming a plug electrode in the opening.

\* \* \* \* \*